(12) United States Patent
Kato et al.

(10) Patent No.: US 8,235,299 B2
(45) Date of Patent: *Aug. 7, 2012

(54) WIRELESS IC DEVICE AND COMPONENT FOR WIRELESS IC DEVICE

(75) Inventors: Noboru Kato, Moriyama (JP); Nobuo Ikemoto, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 740 days.

This patent is subject to a terminal disclaimer.

(21) Appl. No.: 12/339,198

(22) Filed: Dec. 19, 2008

(65) Prior Publication Data

US 2009/0121030 A1    May 14, 2009

Related U.S. Application Data

(63) Continuation of application No. PCT/JP2008/051521, filed on Jan. 31, 2008, and a continuation of application No. PCT/JP2008/061953, filed on Jul. 2, 2008, and a continuation-in-part of application No. 11/964,185, filed on Dec. 26, 2007, now Pat. No. 7,762,472.

(30) Foreign Application Priority Data

| Jul. 4, 2007 | (JP) | 2007-176360 |
| Sep. 19, 2007 | (JP) | 2007-241819 |
| Apr. 14, 2008 | (JP) | 2008-105188 |

(51) Int. Cl.
*G06K 19/06* (2006.01)
(52) U.S. Cl. ...................................... 235/492
(58) Field of Classification Search .............. 235/383, 235/385, 439, 492, 493; 343/700 R
See application file for complete search history.

(56) References Cited

U.S. PATENT DOCUMENTS

| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,757,074 A | 5/1998 | Matloubian et al. |

(Continued)

FOREIGN PATENT DOCUMENTS

EP    0 977 145 A2    2/2000

(Continued)

OTHER PUBLICATIONS

English translation of NL9100176, published on Mar. 2, 1992.

(Continued)

*Primary Examiner* — Seung Lee
(74) *Attorney, Agent, or Firm* — Keating & Bennett, LLP

(57) ABSTRACT

A wireless IC device includes a cutout portion having no aluminum-deposited film that is provided at an end of an article package made of an aluminum-deposited laminated film, and an electromagnetic coupling module is provided at the cutout portion. The electromagnetic coupling module and the aluminum-deposited film of the package define a wireless IC device. A loop electrode, which is a magnetic field transmission auxiliary radiator of the electromagnetic coupling module, is coupled to the aluminum-deposited film of the package. Thus, the article package functions as a radiator of an antenna.

22 Claims, 22 Drawing Sheets

U.S. PATENT DOCUMENTS

| | | | |
|---|---|---|---|
| 5,903,239 A | 5/1999 | Takahashi et al. | |
| 5,936,150 A | 8/1999 | Kobrin et al. | |
| 5,955,723 A | 9/1999 | Reiner | |
| 5,995,006 A | 11/1999 | Walsh | |
| 6,104,311 A | 8/2000 | Lastinger | |
| 6,107,920 A | 8/2000 | Eberhardt et al. | |
| 6,172,608 B1 | 1/2001 | Cole | |
| 6,181,287 B1 | 1/2001 | Beigel | |
| 6,190,942 B1 | 2/2001 | Wilm et al. | |
| 6,259,369 B1 | 7/2001 | Monico | |
| 6,271,803 B1 | 8/2001 | Watanabe et al. | |
| 6,335,686 B1 | 1/2002 | Goff et al. | |
| 6,362,784 B1 | 3/2002 | Kane et al. | |
| 6,367,143 B1 | 4/2002 | Sugimura | |
| 6,378,774 B1 | 4/2002 | Emori et al. | |
| 6,406,990 B1 | 6/2002 | Kawai | |
| 6,448,874 B1 | 9/2002 | Shiino et al. | |
| 6,462,716 B1 | 10/2002 | Kushihi | |
| 6,542,050 B1 | 4/2003 | Arai et al. | |
| 6,600,459 B2 | 7/2003 | Yokoshima et al. | |
| 6,634,564 B2 | 10/2003 | Kuramochi | |
| 6,664,645 B2 | 12/2003 | Kawai | |
| 6,763,254 B2 | 7/2004 | Nishikawa | |
| 6,828,881 B2 | 12/2004 | Mizutani et al. | |
| 6,927,738 B2 | 8/2005 | Senba et al. | |
| 6,963,729 B2 | 11/2005 | Uozumi | |
| 7,036,741 B2* | 5/2006 | Usami et al. | 235/492 |
| 7,088,307 B2 | 8/2006 | Imaizumi | |
| 7,098,852 B2* | 8/2006 | Ikuta et al. | 343/700 MS |
| 7,112,952 B2 | 9/2006 | Arai et al. | |
| 7,119,693 B1 | 10/2006 | Devilbiss | |
| 7,129,834 B2 | 10/2006 | Naruse et al. | |
| 7,248,221 B2 | 7/2007 | Kai et al. | |
| 7,250,910 B2 | 7/2007 | Yoshikawa et al. | |
| 7,276,929 B2 | 10/2007 | Arai et al. | |
| 7,317,396 B2 | 1/2008 | Ujino | |
| 7,405,664 B2 | 7/2008 | Sakama et al. | |
| 2002/0011967 A1 | 1/2002 | Goff et al. | |
| 2002/0044092 A1 | 4/2002 | Kushihi | |
| 2002/0067316 A1 | 6/2002 | Yokoshima et al. | |
| 2004/0001027 A1 | 1/2004 | Killen et al. | |
| 2004/0217915 A1 | 11/2004 | Imaizumi | |
| 2004/0219956 A1 | 11/2004 | Iwai et al. | |
| 2004/0227673 A1 | 11/2004 | Iwai et al. | |
| 2005/0092836 A1 | 5/2005 | Kudo | |
| 2005/0099337 A1 | 5/2005 | Takei et al. | |
| 2005/0125093 A1 | 6/2005 | Kikuchi et al. | |
| 2005/0140512 A1 | 6/2005 | Sakama et al. | |
| 2005/0232412 A1 | 10/2005 | Ichihara et al. | |
| 2005/0236623 A1 | 10/2005 | Takechi et al. | |
| 2005/0275539 A1 | 12/2005 | Sakama et al. | |
| 2006/0001138 A1 | 1/2006 | Sakama et al. | |
| 2006/0043198 A1 | 3/2006 | Forster | |
| 2006/0055601 A1 | 3/2006 | Kameda et al. | |
| 2006/0071084 A1 | 4/2006 | Detig et al. | |
| 2006/0109185 A1 | 5/2006 | Iwai et al. | |
| 2006/0151616 A1* | 7/2006 | Sheats | 235/492 |
| 2006/0158380 A1 | 7/2006 | Son et al. | |
| 2006/0267138 A1 | 11/2006 | Kobayashi | |
| 2007/0004028 A1 | 1/2007 | Lair et al. | |
| 2007/0018893 A1 | 1/2007 | Kai et al. | |
| 2007/0040028 A1 | 2/2007 | Kawamata | |
| 2007/0052613 A1 | 3/2007 | Gallschuetz et al. | |
| 2007/0252700 A1 | 11/2007 | Ishihara et al. | |
| 2007/0285335 A1 | 12/2007 | Bungo et al. | |
| 2008/0024156 A1 | 1/2008 | Arai et al. | |
| 2008/0169905 A1 | 7/2008 | Slatter | |
| 2008/0272885 A1 | 11/2008 | Atherton | |
| 2009/0002130 A1 | 1/2009 | Kato | |

FOREIGN PATENT DOCUMENTS

| | | |
|---|---|---|
| EP | 1 613 134 A2 | 1/2006 |
| JP | 50-143451 A | 11/1975 |
| JP | 62-127140 U | 8/1987 |
| JP | 05-327331 A | 12/1993 |
| JP | 6-53733 A | 2/1994 |
| JP | 06-077729 A | 3/1994 |
| JP | 06-177635 A | 6/1994 |
| JP | 07-183836 A | 7/1995 |
| JP | 08-056113 A | 2/1996 |
| JP | 8-87580 A | 4/1996 |
| JP | 11-149537 A | 6/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-245381 A | 9/1997 |
| JP | 09-252217 A | 9/1997 |
| JP | 09-270623 A | 10/1997 |
| JP | 10-505466 A | 5/1998 |
| JP | 10-171954 A | 6/1998 |
| JP | 10-293828 A | 11/1998 |
| JP | 11-149538 A | 6/1999 |
| JP | 11-219420 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |
| JP | 2000-132643 A | 5/2000 |
| JP | 2000-137778 A | 5/2000 |
| JP | 2000-148948 A | 5/2000 |
| JP | 2000-172812 A | 6/2000 |
| JP | 2000-510271 A | 8/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2001-028036 A | 1/2001 |
| JP | 2007-18067 A | 1/2001 |
| JP | 2001-66990 A | 3/2001 |
| JP | 2001-168628 A | 6/2001 |
| JP | 2001-256457 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-344574 A | 12/2001 |
| JP | 2001-351084 A | 12/2001 |
| JP | 2002-024776 A | 1/2002 |
| JP | 2002-042076 A | 2/2002 |
| JP | 2002-505645 A | 2/2002 |
| JP | 2002-76750 A | 3/2002 |
| JP | 2002-150245 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-230128 A | 8/2002 |
| JP | 2002-298109 A | 10/2002 |
| JP | 2002-319008 A | 10/2002 |
| JP | 2002-362613 A | 12/2002 |
| JP | 2002-373029 A | 12/2002 |
| JP | 2002-373323 A | 12/2002 |
| JP | 2003-016412 A | 1/2003 |
| JP | 2003-030612 A | 1/2003 |
| JP | 2003-44789 A | 2/2003 |
| JP | 2003-58840 A | 2/2003 |
| JP | 2003-067711 A | 3/2003 |
| JP | 2003-076947 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |

| | | | |
|---|---|---|---|
| JP | 2003-187207 A | 7/2003 |
| JP | 2003-187211 A | 7/2003 |
| JP | 2003-198230 A | 7/2003 |
| JP | 2003-209421 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-288560 A | 10/2003 |
| JP | 2003-309418 A | 10/2003 |
| JP | 2003-332820 A | 11/2003 |
| JP | 2004-88218 A | 3/2004 |
| JP | 2004-096566 A | 3/2004 |
| JP | 2004-253858 A | 9/2004 |
| JP | 2004-287767 A | 10/2004 |
| JP | 2004-297249 A | 10/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-136528 A | 5/2005 |
| JP | 2005-165839 A | 6/2005 |
| JP | 2005-167327 A | 6/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-275870 A | 10/2005 |
| JP | 2005-295135 A | 10/2005 |
| JP | 2005-311205 A | 11/2005 |
| JP | 2005-321305 A | 11/2005 |
| JP | 2005-335755 A | 12/2005 |
| JP | 2005-346820 A | 12/2005 |
| JP | 2005-352858 A | 12/2005 |
| JP | 2006-031766 A | 2/2006 |
| JP | 2006-39902 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-148518 A | 6/2006 |
| JP | 2006-195795 A | 7/2006 |
| JP | 2006-270212 A | 10/2006 |
| JP | 2006-309401 A | 11/2006 |
| JP | 2007-65822 A | 3/2007 |
| JP | 2007-150868 A | 6/2007 |
| JP | 11-175678 A | 1/2009 |
| NL | 9100176 A | 3/1992 |
| NL | 9100347 A | 3/1992 |
| WO | 98/40930 A1 | 9/1998 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/115849 A1 | 12/2005 |
| WO | 2006/045682 A | 5/2006 |

OTHER PUBLICATIONS

English translation of NL9100347, published on Mar. 2, 1992.
Kato et al.: "Antenna," U.S. Appl. No. 11/928,502, filed Oct. 30, 2007.
Kato et al.: Wireless IC Device, U.S. Appl. No. 12/211,117, filed Sep. 16, 2008.
Kato et al.: "Antenna," U.S. Appl. No. 11/688,290, filed Mar. 20, 2007.
Kato et al.: "Electromagnetic-Coupling-Module-Attached Article," U.S. Appl. No. 11/740,509, filed Apr. 26, 2007.
Kato et al.: "Product Including Power Supply Circuit Board," U.S. Appl. No. 12/234,949, filed Sep. 22, 2008.
Kato et al.: "Data Coupler," U.S. Appl. No. 12/252,475, filed Oct. 16, 2008.
Kato et al.; "Information Terminal Device," U.S. Appl. No. 12/267,666, filed Nov. 10, 2008.
Kato et al.: "Wireless IC Device and Wireless IC Device Composite Component," U.S. Appl. No. 12/276,444, filed Nov. 24, 2008.
Dokai et al.: "Optical Disc," U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System," U.S. Appl. No. 12/274,400, filed Nov. 20, 2008.
Kato: "Wireless IC Device," U.S. Appl. No. 11/964,185, filed Dec. 26, 2007.
Kato et al.: "Radio Frequency IC Device," U.S. Appl. No. 12/336,629, filed Dec. 17, 2008.
Dokai et al.: "Wireless IC Device and Component for Wireless IC Device," U.S. Appl. No. 12/359,690, filed Jan. 26, 2009.
Ikemoto et al.: "Wireless IC Device," U.S. Appl. No. 11/851,651, filed Sep. 7, 2007.
Kataya et al.: "Wireless IC Device and Electronic Device," U.S. Appl. No. 11/851,661, filed Sep. 7, 2007.
Dokai et al.: "Antenna and Radio IC Device," U.S. Appl. No. 12/350,307, filed Jan. 8, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device," U.S. Appl. No. 11/624,382, filed Jan. 18, 2007.
Dokai et al.: "Wireless IC Device, and Component for Wireless IC Device," U.S. Appl. No. 11/930,818, filed Oct. 31, 2007.
Kato et al.: "Wireless IC Device," U.S. Appl. No. 12/042,399, filed Mar. 5, 2008.
Official communication issued in related U.S. Appl. No. 12/042,399; mailed on Aug. 25, 2008.
Official Communication issued in corresponding European Patent Application No. 08777756.1, mailed on May 30, 2011.
Official Communication issued in International Patent Application No. PCT/JP2008/061953, mailed on Oct. 14, 2008.
Official Communication issued in International Patent Application No. PCT/JP2008/051521, mailed on May 13, 2008.
Kato; "Wireless IC Device"; U.S. Appl. No. 11/964,185, filed Dec. 26, 2007.
Official Communication issued in corresponding European Patent Application No. 08777756.1, mailed on Jul. 9, 2010.
Official Communication issued in corresponding European Patent Application No. 11155422.6, mailed on Jun. 9, 2011.

* cited by examiner

WIRELESS IC DEVICE AND COMPONENT FOR WIRELESS IC DEVICE

BACKGROUND OF THE INVENTION

1. Field of the Invention

The present invention relates to a wireless IC device used for a radio frequency identification (RFID) system that performs data communication in a non-contact manner using electromagnetic waves, and a component for the wireless IC device.

2. Description of the Related Art

In recent years, an article management system has used an RFID system which includes a reader/writer that generates an induction field and a wireless IC device that stores predetermined information allocated to an article, and non-contact communication is established between the reader/writer and the wireless IC device to transmit the information therebetween.

FIGS. 1A and 1B are views that show an example of a non-contact IC tag (wireless IC device) in which an IC tag label is attached to an IC tag antenna, which is described in Japanese Unexamined Patent Application Publication No. 2003-243918. FIG. 1A is a plan view. FIG. 1B is an enlarged cross-sectional view taken along the line A-A in FIG. 1A. The non-contact IC tag antenna includes two separated antenna patterns 91 and 92. The antenna patterns 91 and 92 are each made of a layer of metal thin films.

Antennas 101 and 102 are provided on a label base material 82b of the non-contact IC tag label 82, and an IC chip 85 is mounted thereon. The antennas 101 and 102 of the non-contact IC tag label 82 are arranged to be in contact with the antenna patterns 91 and 92 via an anisotropic conductive adhesive 84 to thereby define a non-contact IC tag 90.

A sealant film 83 is laminated on the label base material 82b to prevent peeling of the IC tag label, and finally, an IC tag attached package 81 is provided.

The non-contact IC tag disclosed in Japanese Unexamined Patent Application Publication No. 2003-243918 and the package provided with the non-contact IC tag have the following problems.

Because antenna patterns are formed in a process that is different from the process in which a package is formed, a process of producing an antenna is required. This causes the process to be lengthened and requires an additional member which increases the production costs of the package.

To obtain a sufficient radiation characteristic, it is necessary to increase the size of the antenna pattern, and, therefore, it is difficult to attach a tag to a small article.

Because a tag is disposed on the base material of an article and another film covers the surface of the tag, the thickness of the IC tag formation portion is increased.

SUMMARY OF THE INVENTION

To overcome the problems described above, preferred embodiments of the invention provide a wireless IC device that reduces production costs for a package, enables attachment to a small article, and reduces the thickness of the tag formation portion.

A wireless IC device according to a preferred embodiment of the present invention includes a high-frequency device, which is an electromagnetic coupling module or a wireless IC chip itself, said electromagnetic coupling module including a wireless IC and a power supply circuit substrate that is electrically connected or electromagnetically coupled to the wireless IC while being coupled to an external circuit, and a radiation electrode which is defined by a portion of an article and operates as a radiator, wherein the high-frequency device is mounted on the radiation electrode, and the radiation electrode is coupled to the high-frequency device.

With the configuration described above, for example, processes or members necessary to form the antenna pattern shown in FIGS. 1A and 1B on an article are not required. Thus, the cost of providing a wireless IC device for an article is not significantly increased.

In addition, because a portion of or substantially the entire article may be utilized as a radiator, a sufficient radiation characteristic may be obtained even when it is attached to a relatively small article.

Furthermore, because the thickness of a portion on a base material of the article, at which the high-frequency device is provided, can be reduced, the high-frequency device portion does not significantly protrude from the article, and therefore, the appearance thereof is not adversely affected.

Moreover, by using the electromagnetic coupling module, impedance matching between the wireless IC chip and the radiation electrode may be designed within the power supply circuit substrate. Thus, it is not necessary to limit the shape or material of the radiation electrode, and it may be applied to any article.

The radiation electrode includes a conductive portion having a predetermined area, wherein a cutout portion is provided at an edge of the conductive portion, and wherein the high-frequency device is arranged at the cutout portion while the high-frequency device is coupled to the conductive portion at the cutout portion of the conductive portion. With the above-described configuration, the high-frequency device may preferably be arranged so as not to protrude from the profile of an article, and the conductive portion may be effectively used as a radiator.

The radiation electrode includes a conductive portion having a predetermined area, wherein the conductive portion includes a non-conductive portion, and wherein the high-frequency device is arranged at an end in the non-conductive portion while the high-frequency device is coupled to the conductive portion around the non-conductive portion. With the above-described configuration, the high-frequency device may preferably be arranged so as not to protrude from the profile of an article, and the conductive portion may be effectively used as a radiator.

In addition, the wireless IC device according to preferred embodiments of the invention preferably includes a loop electrode that is coupled to the high-frequency device and that is directly electrically connected to the radiation electrode, wherein the loop electrode is provided at a mounting portion at which the high-frequency device (adjacent to a mounting area) is mounted, such that a loop plane of the loop electrode is arranged substantially in a direction of a plane of the radiation electrode. With the above-described configuration, it is possible to easily match the high-frequency device with the loop electrode, and the loop electrode is strongly coupled to the radiation electrode, such that a high gain may be obtained.

In addition, the wireless IC device according to preferred embodiments of the present invention preferably includes a loop electrode provided at a mounting portion (adjacent to a mounting area) at which the high-frequency device is mounted, wherein the loop electrode is coupled to the high-frequency device and is electromagnetically coupled to the radiation electrode via an insulating layer. With the above-described configuration, it is possible to easily match the high-frequency device with the loop electrode, and the loop electrode is insulated from direct current from the radiation electrode, such that it is possible to improve resistance against static electricity.

A matching circuit is preferably provided between the mounting portion of the high-frequency device and the loop electrode, wherein the matching circuit directly electrically connects the high-frequency device with the loop electrode. With the above-described configuration, the matching circuit may be used as an inductor arranged to match an impedance between the radiation electrode and the high-frequency device. Thus, the degree of freedom to design impedance matching for a wireless IC device is increased, and, in addition, the design is facilitated.

A resonant circuit and/or a matching circuit is provided in the power supply circuit substrate. According to the above configuration, selectivity of frequency increases. Thus, the operating frequency of the wireless IC device may be mostly determined using the self-resonant frequency. In accordance with the above, it is possible to transfer or exchange energy of a signal having a frequency used in an RFID system with high efficiency. This may improve the radiation characteristic of the wireless IC device.

In addition, by providing the matching circuit in the power supply circuit substrate, it is possible to more efficiently exchange or transfer energy of a signal having a frequency used in an RFID system.

A resonant frequency of the resonant circuit preferably substantially corresponds to a frequency of a signal exchanged by the radiation electrode.

With this configuration, the radiation electrode is easily coupled to a power supply circuit portion and only needs to have a size corresponding to a required gain. It is not necessary to limit the shape or material of the radiation electrode depending on a frequency used, and it may be used with any article.

The radiation electrode is preferably, for example, a metal film layer of an article package in which a sheet having a conductive layer is formed into a bag shape or a package shape. With the above-described configuration, an article package having a metal film layer may preferably be used without any change, and substantially the entire article operates as a radiator. Even when a plurality of articles are overlapped, the ID of each article may be read.

The radiation electrode is preferably an electrode pattern provided, for example, on a circuit substrate in an electronic device. With the above-described configuration, the circuit substrate provided in the electronic device may be used without any change, and mounting of the high-frequency device is facilitated.

The radiation electrode is preferably a metal plate provided on a rear surface of a component, such as a liquid crystal display panel, in an electronic device. With the above-described configuration, the component provided in the electronic device may preferably be used without any change, and the size and cost thereof are not increased.

A resonant conductor that has a resonant frequency that is substantially equal to an operating frequency of the high-frequency device or a frequency that is close to the operating frequency is preferably provided, wherein the resonant conductor is coupled to the high-frequency device. With the above-described configuration, a radiation gain at the operating frequency of an RFID tag is increased, and an outstanding characteristic is obtained as an RFID. In addition, because the resonant frequency of the resonant conductor is not influenced by components mounted on the printed wiring substrate, the design thereof is facilitated.

The resonant conductor is preferably arranged substantially parallel to an edge portion of the radiation electrode, at which the cutout portion is provided. With the above-described configuration, coupling between the resonant conductor and the radiation electrode is strong and, therefore, a high gain characteristic may be obtained.

The resonant conductor preferably has a length that is substantially equal to a side of the radiation electrode, which the resonant conductor is located adjacent to. With the above-described configuration, coupling between the resonant conductor and the radiation electrode is strong and, therefore, a high gain characteristic may be obtained.

The resonant conductor is preferably arranged so that a portion of the resonant conductor located adjacent to a location at which the high-frequency device is arranged is located substantially at the center. With the above-described configuration, coupling between the resonant conductor and the high-frequency device is strong and, therefore, a high gain characteristic may be obtained.

A plurality of the high-frequency devices are preferably provided, and the resonant conductor is preferably coupled to each of the high-frequency devices. With the above-described configuration, the number of required resonant conductors may be reduced, and the area occupied on the printed wiring substrate may be reduced. Thus, manufacturing cost may be reduced.

The resonant conductor is preferably separable from a body that defines the radiation electrode. With the above-described configuration, in the manufacturing process, a relatively large communication distance with a reader/writer may be maintained, and after manufacturing, the size of the printed wiring substrate is not increased. In addition, it is possible to provide communication as required by moving the resonant conductor close to the reader/writer.

The resonant conductor is preferably arranged in a margin portion of a printed wiring substrate. With the above-described configuration, the cost of manufacturing the printed wiring substrate may be reduced.

A casing of a device on which the wireless IC device is mounted or another component mounted on the device also preferably functions as the resonant conductor. With the above-described configuration, it is possible to obtain a required gain even with a metal case or a mounted component.

A component for a wireless IC device preferably includes a high-frequency device, which is an electromagnetic coupling module or a wireless IC, including a wireless IC and a power supply circuit substrate that is electrically connected or electromagnetically coupled to the wireless IC while being coupled to an external circuit, and a substrate on which the high-frequency device is mounted and which includes at least two linear electrodes, first ends of which are coupled to the high-frequency device.

With the above-described configuration, if the article includes only a conductor that operates as a radiator, by merely assembling the component of a wireless IC device to that article, the article may be used as an RFID tag attached article.

In the linear electrode, the other ends of the linear electrodes are preferably electrically connected to each other to define a loop electrode. With the above-described configuration, the loop shape of the loop electrode is not influenced by the assembly process, such as soldering, and therefore, a highly accurate design with less variation in impedance may be achieved.

A wireless IC device preferably includes the component for a wireless IC device described above, and an article having a radiation electrode that is electrically connected to the other ends of the at least two linear electrodes to define a loop electrode. With the above-described configuration, it is possible to easily form an RFID tag attached article.

A wireless IC device preferably includes the component for a wireless IC device described above, and an article provided with a conductor that is coupled to the loop electrode and operates as a radiator. With the above-described configuration, it is possible to easily form an RFID tag attached article. In addition, when the article is an electronic component, it is possible to reduce variations in characteristic thereof.

According to preferred embodiments of the present invention, the following advantageous effects are obtained. For example, processes or members arranged to define an antenna pattern shown in FIGS. 1A and 1B on an article are not required. Thus, there is no significant increase in the cost of providing a wireless IC device for an article.

In addition, because a portion of or the entire article may be used as a radiator, a sufficient radiation characteristic may be obtained even when it is attached to a small article.

Furthermore, because the thickness of a portion on a base material of the article at which the high-frequency device is provided may be reduced, the high-frequency device portion does not significantly protrude, and therefore, the appearance is not adversely affected.

Moreover, by using the electromagnetic coupling module, impedance matching between the wireless IC chip and the radiation electrode may be designed within the power supply circuit substrate. Thus, it is not necessary to limit the shape or material of the radiation electrode, and it may be applied to any articles.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

Figure 1A:
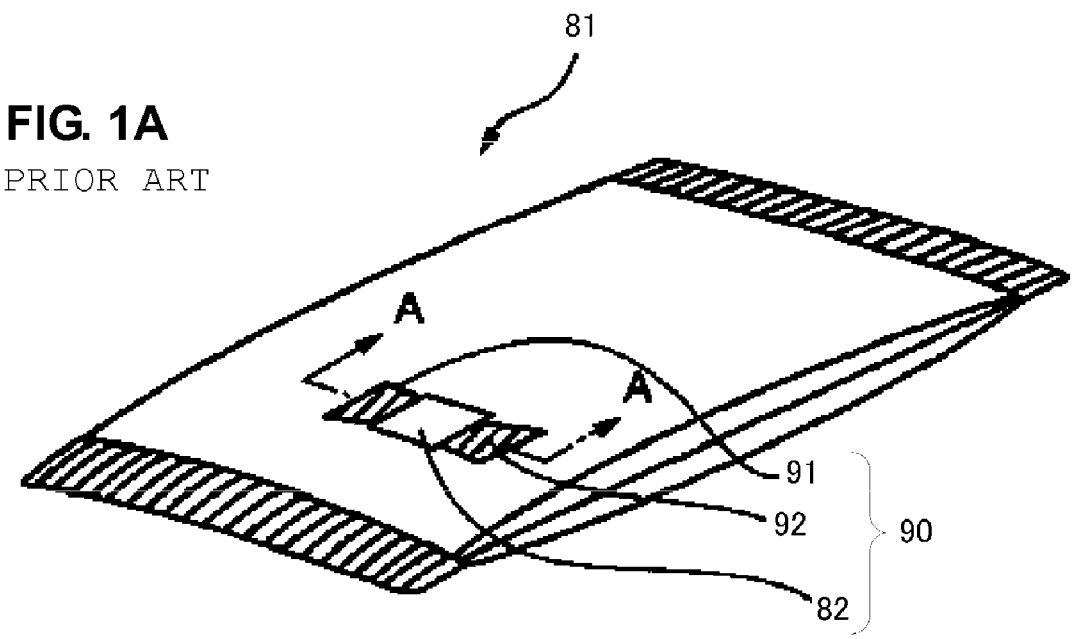
FIGS. 1A and 1B are views that show the configuration of a wireless IC device according to the related art.
Figure 1B:
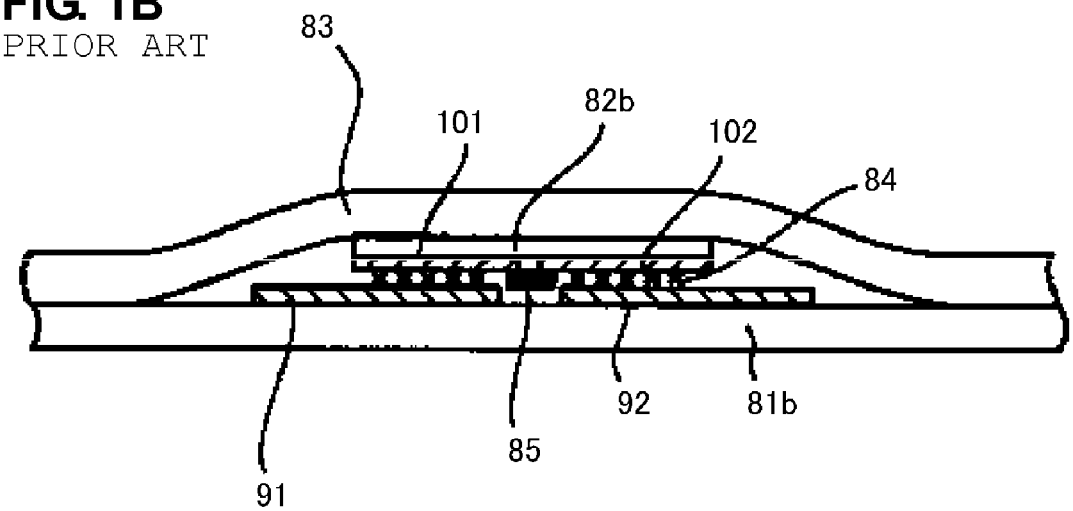
Figure 2:
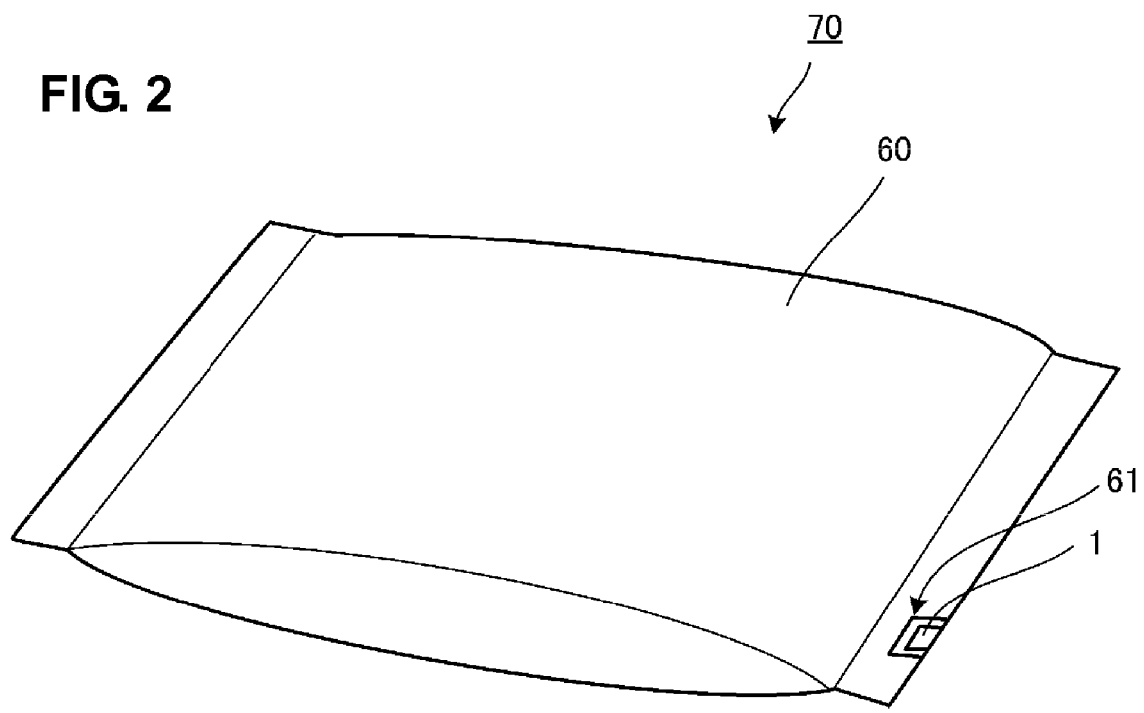
FIG. 2 is a view that shows the configuration of a wireless IC device according to a first preferred embodiment of the present invention and the configuration of an article provided with the wireless IC device.

FIG. 2 is an external perspective view that shows the configuration of a wireless IC device according to a first preferred embodiment of the present invention and the configuration of an article provided with the wireless IC device. The article 70 is, for example, a packaged snack, such as potato chips. An article package 60 is a package that preferably includes an aluminum-deposited laminated film formed into a bag shape.

A cutout portion (a portion at which aluminum is not vapor-deposited) 61 is provided at an edge portion of the article package 60, and an electromagnetic coupling module 1 is arranged in the cutout portion 61.

Figure 3A:
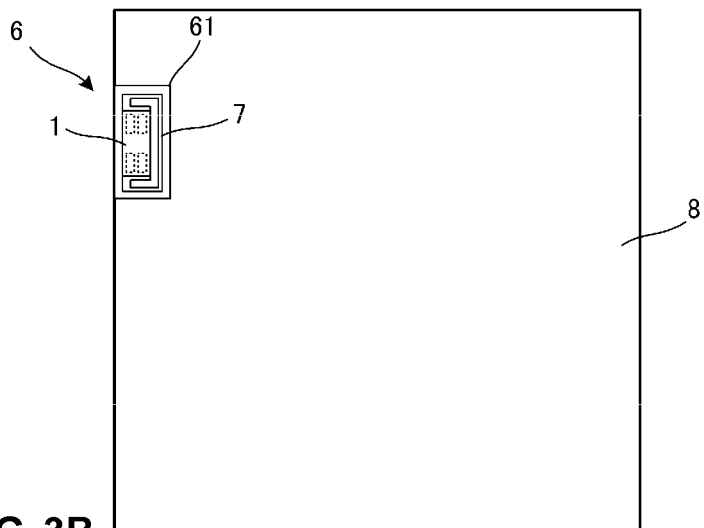
FIGS. 3A and 3B are configuration diagrams of the wireless IC device, showing only a relevant portion of the article shown in FIG. 2.
Figure 3B:
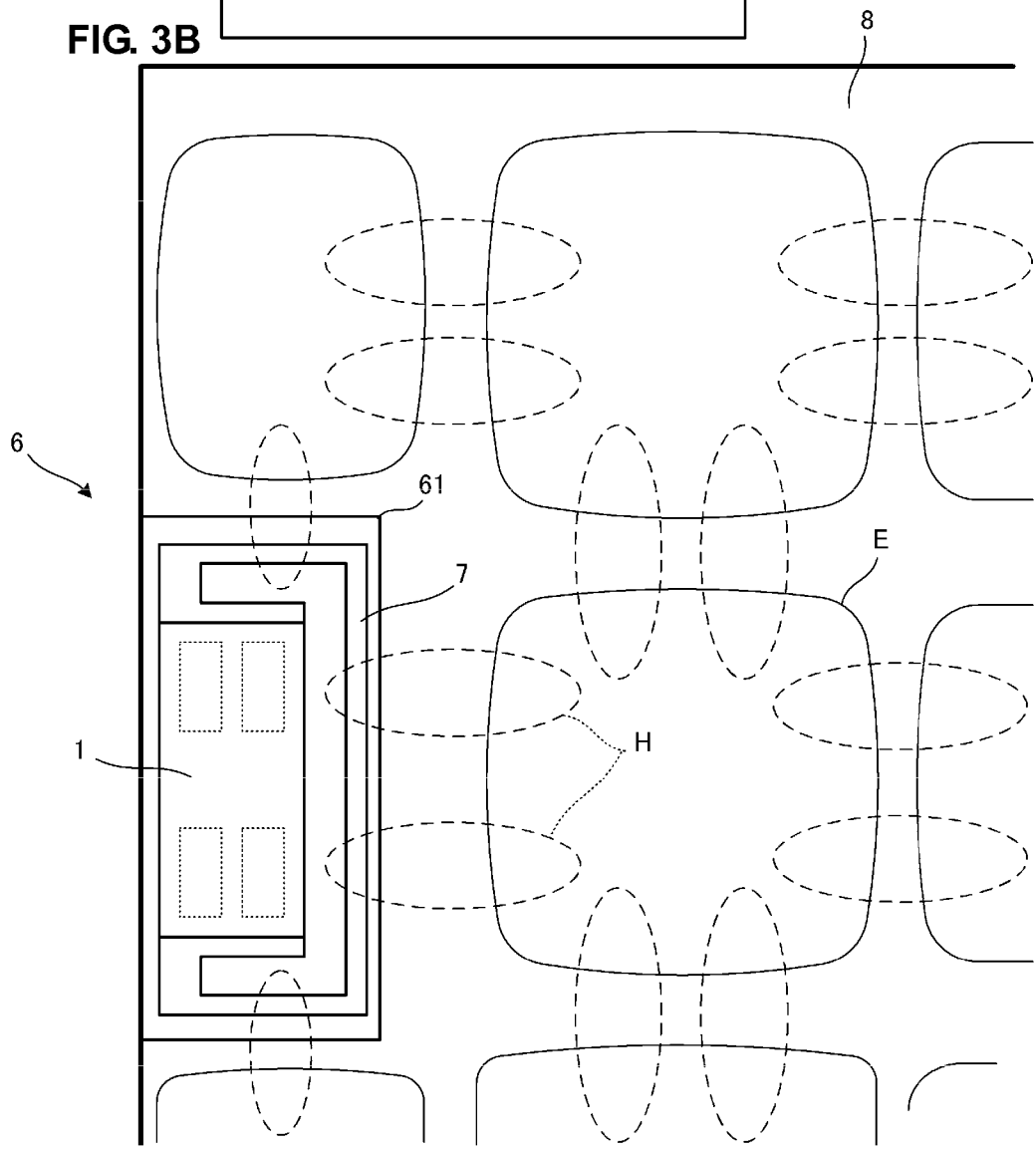

FIGS. 3A and 3B are views that show the configuration of a wireless IC device and only a relevant portion of the article 70 shown in FIG. 2. In FIGS. 3A and 3B, a radiation electrode 8 corresponds to an aluminum-deposited layer of the aluminum-deposited laminated film of the article package 60 shown in FIG. 2. The cutout portion (electrode non-formation portion) 61 of the radiation electrode 8 includes a loop electrode 7 disposed therein, and the electromagnetic coupling module 1 is mounted at the cutout portion 61 so as to be coupled to the loop electrode 7. The loop electrode 7 is patterned when aluminum deposition of the aluminum-deposited laminated film is performed. Alternatively, a conductive pattern may be formed by printing in a different process from the process of aluminum deposition.

FIG. 3B schematically shows an example of a distribution of electromagnetic field that is generated in the radiation electrode 8 when the loop electrode 7 is provided as a transmission auxiliary radiator. In FIG. 3B, the broken line represents the loop of a magnetic field H, and the solid line represents the loop of an electric field E. The loop electrode 7 is applied as a magnetic field transmission auxiliary radiator. The magnetic field H generated by the loop electrode 7 substantially perpendicularly intersects the radiation electrode 8 to induce the electric field E. The electric field loop induces a magnetic field loop, and the chain of that action extends the distribution of electromagnetic field.

This example is described using the loop electrode 7 as a transmission auxiliary radiator. When the loop electrode 7 is applied as a reception auxiliary radiator as well, a similar action may be achieved to obtain a high gain.

In this manner, when the article includes a conductive portion having a predetermined area and the conductive portion functions as a radiator, and when a large number of the articles are overlapped, chain induction of the electric field and magnetic field propagates among the articles. Thus, even when a large number of articles are overlapped, the wireless IC device operates to obtain a high gain. For example, when the antenna of a reader/writer is brought into close proximity to a portion of a pile of packed potato chips, IDs of all of the pile of packed potato chips may be read.

Note that the electromagnetic coupling module 1 shown in FIGS. 3A and 3B includes a wireless IC chip, which will be described later, and a power supply circuit substrate that is connected to the wireless IC chip and that is coupled to an external circuit, i.e., the loop electrode 7, and the radiation electrode 8 via the loop electrode 7. The wireless IC chip and the power supply circuit substrate may be connected electrically or may be coupled electromagnetically. When they are coupled electromagnetically, a capacity is provided between connection electrodes thereof with a dielectric thin film, or other suitable element. By capacitively coupling the wireless IC chip and the power supply circuit substrate, it is possible to prevent the wireless IC chip from being broken by static electricity.

In addition, when the power supply circuit substrate is provided, two electrodes of the power supply circuit substrate are coupled electromagnetically to both ends of the loop electrode 7. In addition, the electromagnetic coupling module 1 may be replaced with a single piece of wireless IC chip. In this case, two electrodes of the wireless IC chip may be directly connected to both ends of the loop electrode 7. In any case, because the loop electrode 7 is separated from a direct current of the radiation electrode 8, the wireless IC device is advantageously resistant against static electricity.

In addition, the loop electrode 7 may have any shape as long as the loop electrode 7 is arranged so as to couple input and output terminals of the electromagnetic coupling module 1.

Second Preferred Embodiment

Figure 4:
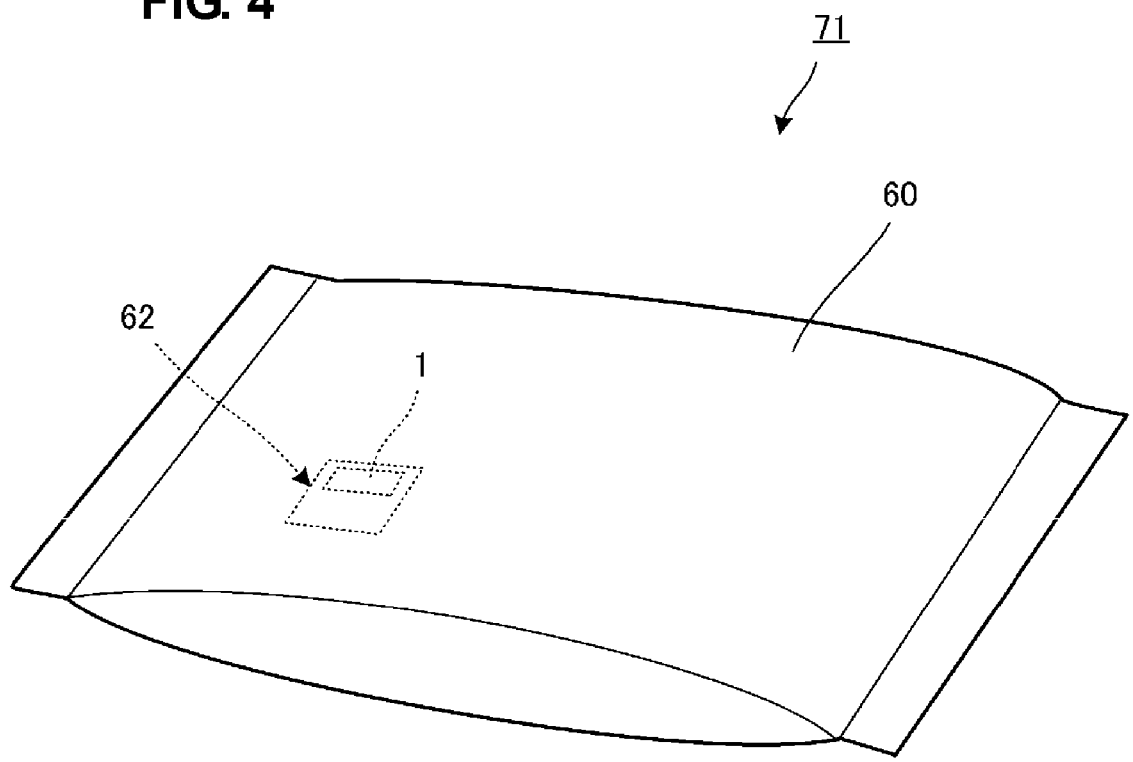
FIG. 4 is a view that shows the configuration of a wireless IC device according to a second preferred embodiment of the present invention and the configuration of an article provided with the wireless IC device.

FIG. 4 is an external perspective view that shows the configuration of a wireless IC device according to a second preferred embodiment of the present invention and the configuration of an article provided with the wireless IC device. The article 71 is, for example, a packaged snack. An article package 60 is formed so that an aluminum-deposited laminated film has a bag shape.

In the example shown in FIG. 2, the electromagnetic coupling module is arranged at an edge portion of the article package, whereas in FIG. 4, the electromagnetic coupling module 1 is provided at a portion of the article package 60, away from the edge portion of the article package 60. The article package 60 is preferably made of an aluminum-deposited laminated film. A portion of the article package 60, at which aluminum is not deposited, is provided as a non-conductive portion 62. The electromagnetic coupling module 1 is arranged inside the non-conductive portion 62 and at an end of the non-conductive portion 62.

Figure 5:
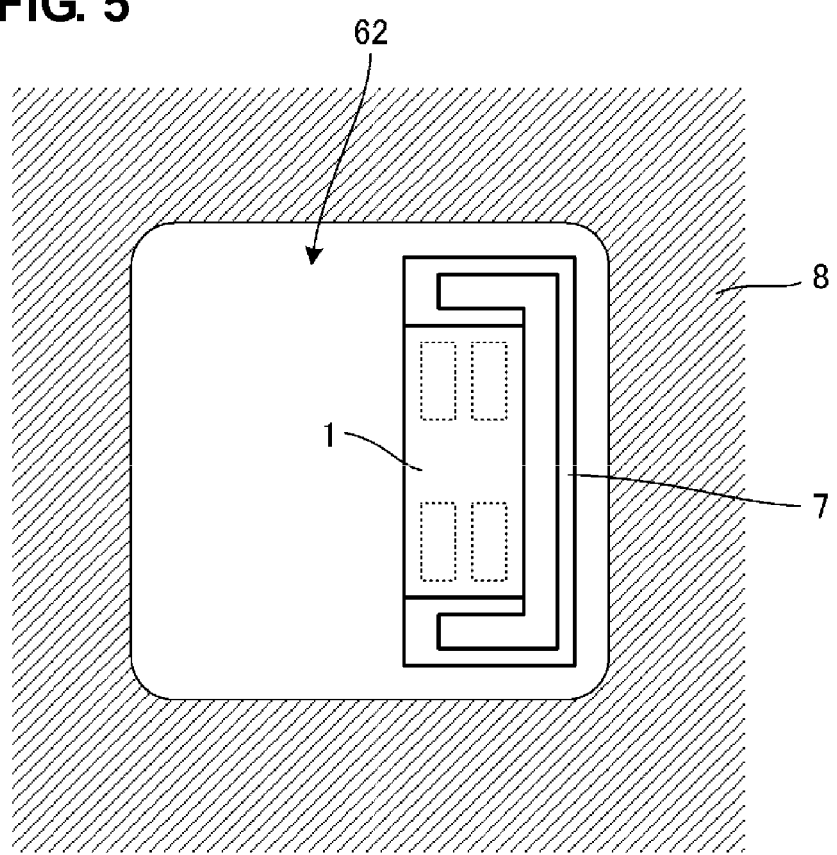
FIG. 5 is a configuration diagram of the wireless IC device, showing only a relevant portion of the article shown in FIG. 3.

FIG. 5 is a view that shows a portion at which the electromagnetic coupling module 1 shown in FIG. 4 is mounted. In FIG. 5, the configuration of the loop electrode 7 and electromagnetic coupling module 1 is similar to that shown in FIGS. 3A and 3B in the first preferred embodiment. The radiation electrode 8 corresponds to the aluminum-deposited layer of the aluminum-deposited laminated film of the article package 60. The loop electrode 7 and the electromagnetic coupling module 1 are arranged inside the non-conductive portion 62 so that the loop electrode 7 is preferably located adjacent to three sides of the radiation electrode 8.

With the above-described configuration, the loop electrode 7 operates as a magnetic field transmission auxiliary radiator. The loop electrode 7 is coupled to the radiation electrode 8 and, similar to that shown in FIGS. 3A and 3B, the radiation electrode 8 operates as a radiator of an antenna.

Note that when the area of the non-conductive portion 62 is set to be substantially equal to the area occupied by the loop electrode 7 and the electromagnetic coupling module 1 and the loop electrode 7 and the electromagnetic coupling module 1 are arranged inside the non-conductive portion 62, the magnetic field of the loop electrode 7 is coupled to the radiation electrode 8 at four sides. Therefore, an electromagnetic field induced by the radiation electrode 8 is cancelled to reduce the gain. Thus, it is important that the area of the non-conductive portion 62 is sufficiently greater than the area occupied by the loop electrode 7 and the electromagnetic coupling module 1, and the loop electrode 7 is located adjacent to the radiation electrode 8 at only one side, two sides, or three sides.

Third Preferred Embodiment

Figure 6A:
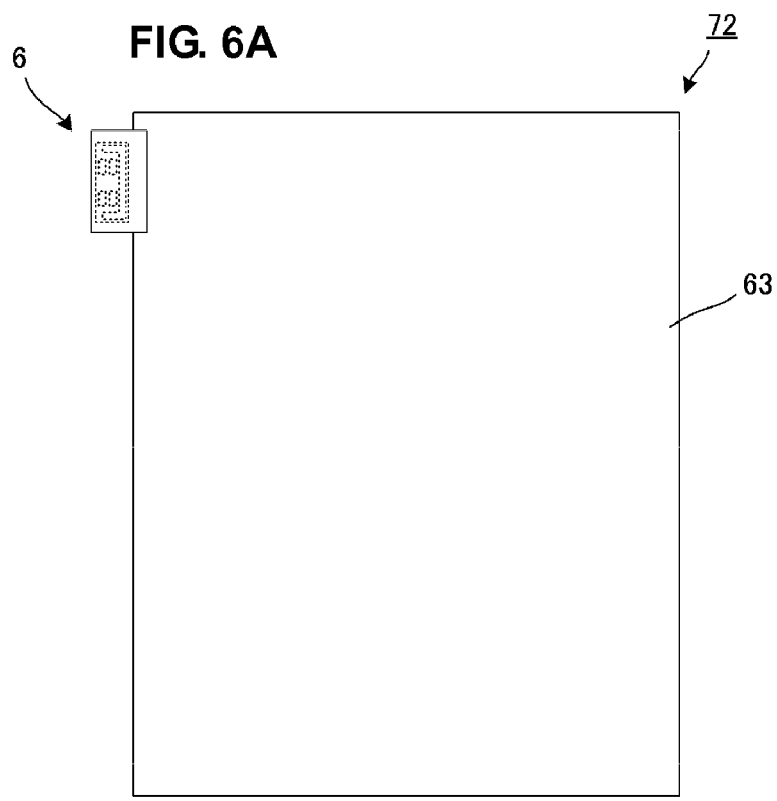
FIGS. 6A and 6B are views that show the configuration of a wireless IC device according to a third preferred embodiment of the present invention and the configuration of an article provided with the wireless IC device.
Figure 6B:
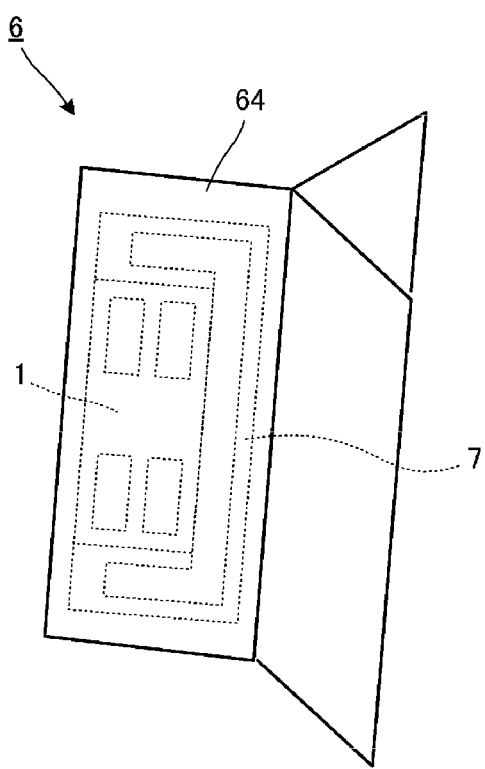

FIG. 6B shows the configuration of a main portion of a wireless IC device according to a third preferred embodiment of the present invention. FIG. 6A is an external view of an article provided with the wireless IC device. In FIG. 6A, the article 72 is configured such that a main portion 6 of the wireless IC device is provided on the metal substantially planar body 63. The metal substantially planar body 63 preferably is a plate-shaped or sheet-shaped article that includes a metal layer therein or a metal plate itself.

The main portion 6 of the wireless IC device has a tuck index shape as shown in FIG. 6B and includes an adhesive layer on the inner surface of an insulative sheet 64. The loop electrode 7 and the electromagnetic coupling module 1 are sandwiched by the insulative sheet 64. The configuration of the loop electrode 7 and electromagnetic coupling module 1 is similar to that shown in FIGS. 3A and 3B.

Then, the loop electrode 7 is attached so as to be located adjacent to an edge of the metal plane body 63 shown in FIG. 6A, that is, such that a tuck index is adhered only to the edge.

Even when no cutout is provided at an edge portion of the conductive portion as described above, by arranging the loop electrode 7 of the main portion 6 of the wireless IC device close to the edge portion of the metal plane body 63, the loop electrode 7 and the metal plane body 63 are coupled to each other. Thus, the metal plane body 63 operates as a radiator of an antenna.

Fourth Preferred Embodiment

A wireless IC device according to a fourth preferred embodiment of the present invention will be described with reference to FIG. 7 and FIGS. 8A and 8B. The wireless IC device according to the fourth preferred embodiment is preferably applied to a recording medium having a metal film, such as a DVD, for example.

Figure 7:
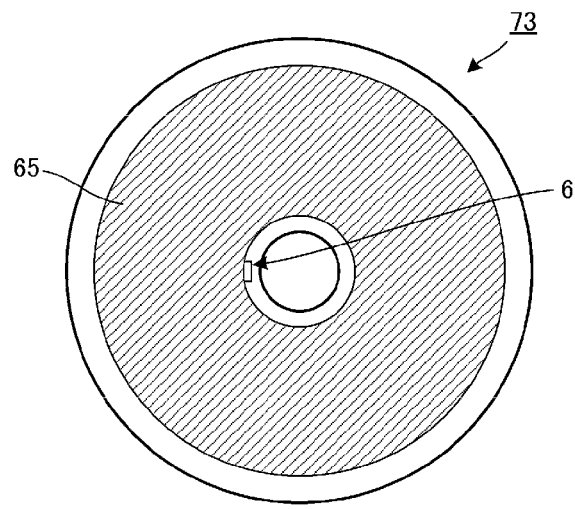
FIG. 7 is a view that shows the configuration of a wireless IC device according to a fourth preferred embodiment of the present invention and the configuration of an article provided with the wireless IC device.

FIG. 7 is a plan view of a DVD disk. FIG. 8A is a center cross-sectional view that is taken along the line passing through the main portion 6 of the wireless IC device, and FIG. 8B is a partially enlarged plan view of the main portion 6 of the wireless IC device. However, the cross-sectional view of FIG. 8A is exaggerated in size in the thickness direction.

Figure 8A:
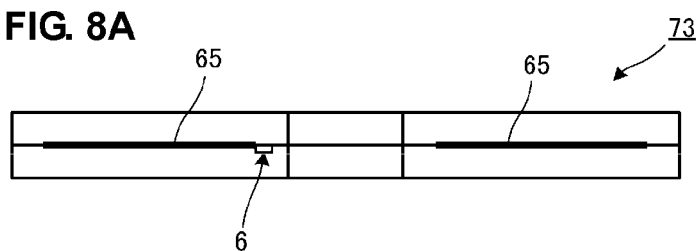
FIGS. 8A and 8B are a center cross-sectional view that is taken along the line passing a main portion of the wireless IC device and a partially enlarged plan view of the main portion of the wireless IC device.

As shown in FIG. 7 and FIG. 8A, the DVD disc 73 is formed by adhering two disc-shaped discs, one of the discs has a metal film 65 formed thereon, and the main portion 6 of the wireless IC device is provided at portion of the inner peripheral edge of the metal film 65.

Figure 8B:
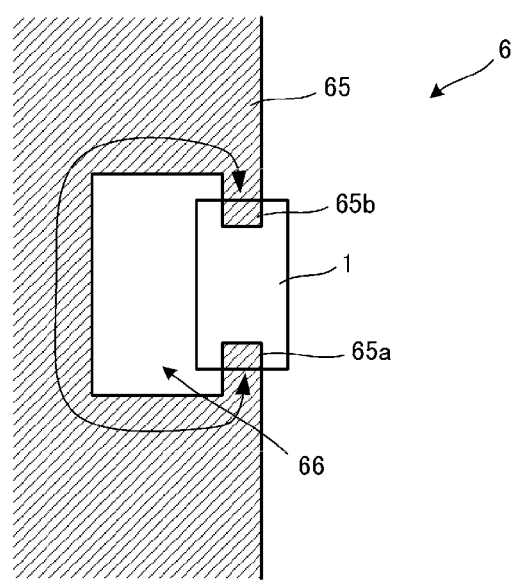

As shown in FIG. 8B, a substantially C-shaped cutout portion 66 is provided at a portion of the inner peripheral edge of the metal film 65. The cutout portion 66 is not a cutout of the disc but is a cutout portion of the metal film. The electromagnetic coupling module 1 is arranged so that two terminals of the electromagnetic coupling module 1, defined by the substantially C-shaped cutout portion, face two protruding ends facing each other. The inner peripheral end (portion indicated by the arrow in the drawing) of the substantially C-shaped cutout portion functions as a loop electrode.

Fifth Preferred Embodiment

Figure 9A:
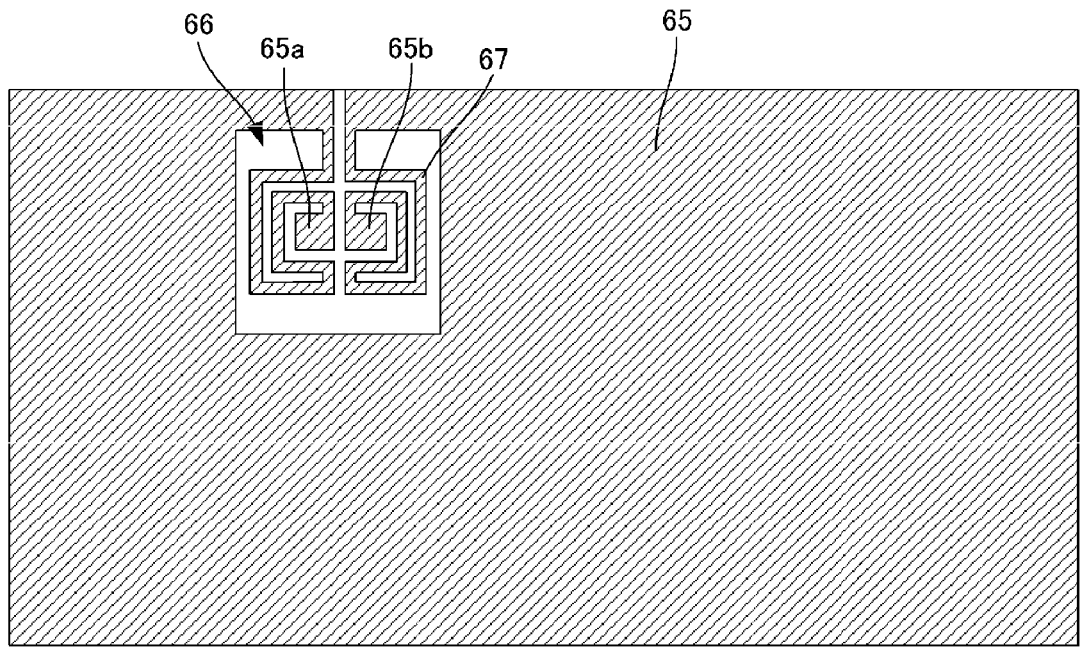
FIGS. 9A and 9B are views that show the configuration of a wireless IC device according to a fifth preferred embodiment of the present invention.
Figure 9B:
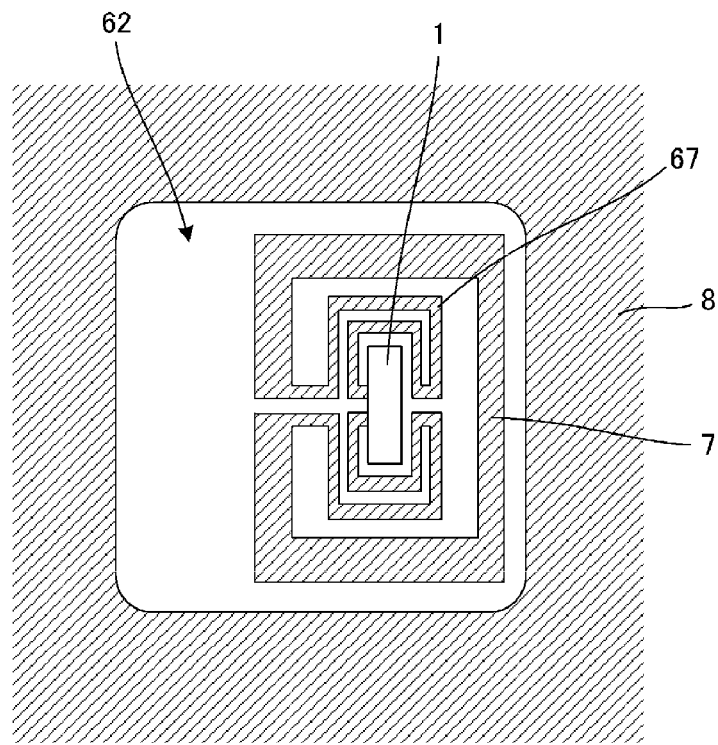

FIGS. 9A and 9B are views that show the configuration of two wireless IC devices according to a fifth preferred embodiment of the present invention. The fifth preferred embodiment provides a matching circuit between a mounting portion of a high-frequency device and a loop electrode. The matching circuit establishes direct electrical connection between the high-frequency device and the loop electrode.

In FIG. 9A, the metal film 65 is formed into a sheet material or a plate material, and functions as a radiator. By providing a cutout portion 66 at a portion of the metal film 65, the portion extending along the inner peripheral edge of the cutout portion 66 functions as a loop electrode.

The matching circuit 67 defined by a meandering electrode and metal film portions 65a and 65b, which are mounting portions for the high-frequency device, e.g., an electromagnetic coupling module or a wireless IC chip, are provided inside the cutout portion 66.

By providing the matching circuit 67 in this manner, the wireless IC chip may be directly mounted at the metal film portions 65a and 65b. Note that when the wireless IC chip is directly mounted on the loop electrode, the loop electrode including the matching circuit 67 substantially determines the operating frequency of the wireless IC device.

In FIG. 9B, the radiation electrode 8 includes the non-conductive portion 62 provided therein, and the loop electrode 7, the matching circuit 67, and the electromagnetic coupling module 1 are arranged inside the non-conductive portion 62 such that the loop electrode 7 is located adjacent to three sides of the radiation electrode 8. The configuration of the matching circuit 67 and mounting portion of the electromagnetic coupling module 1 is similar to that shown in FIG. 9A.

With the above-described configuration, the loop electrode 7 operates as a magnetic field radiator. The loop electrode 7 is coupled to the radiation electrode 8 and, due to an action similar to that shown in FIGS. 3A and 3B, the radiation electrode 8 functions as a radiator.

Note that the metal film 65 in FIG. 9A or the radiation electrode 8 in FIG. 9B may preferably be, for example, a solid electrode that is provided on the circuit substrate inside a cellular phone terminal.

Sixth Preferred Embodiment

Figure 10:
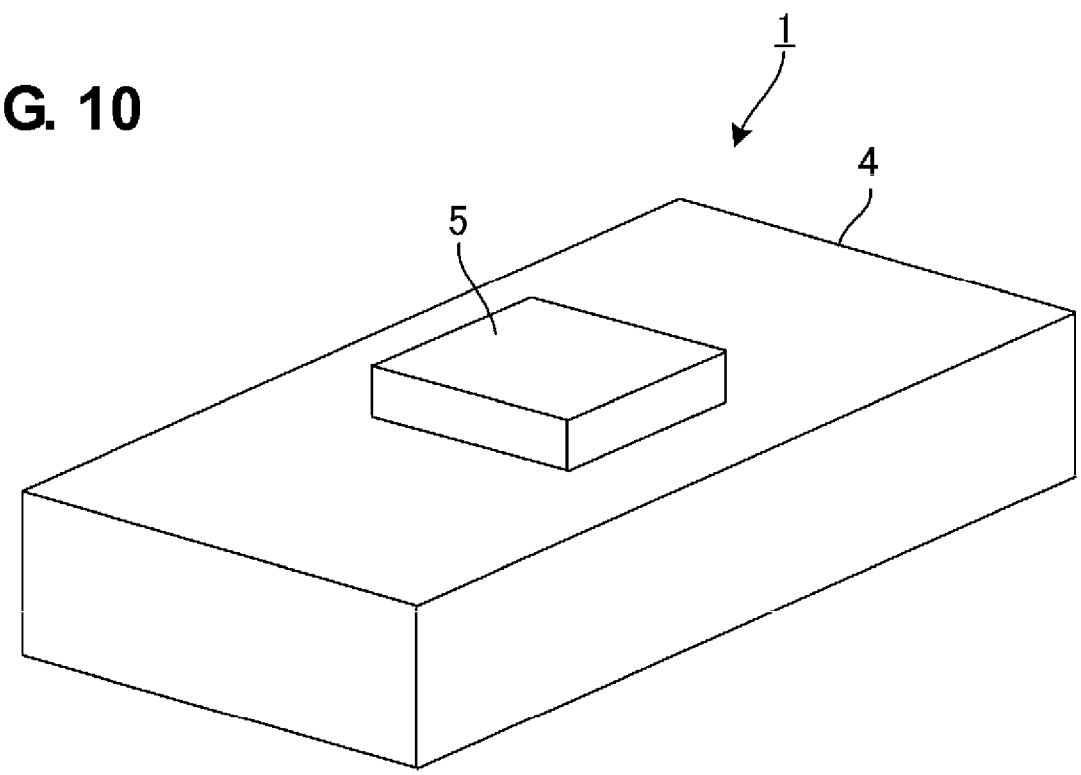
FIG. 10 is an external perspective view of an electromagnetic coupling module used for a wireless IC device according to a sixth preferred embodiment of the present invention.

FIG. 10 is an external perspective view of an electromagnetic coupling module 1 used for a wireless IC device according to a sixth preferred embodiment of the present invention. The electromagnetic coupling module 1 may be applied to the wireless IC devices in the other preferred embodiments. The electromagnetic coupling module 1 includes a wireless IC chip 5 and a power supply circuit substrate 4. The power supply circuit substrate 4 matches an impedance between the metal film 65, which functions as a radiator, and the wireless IC chip 5, and also functions as a resonant circuit.

Figure 11:
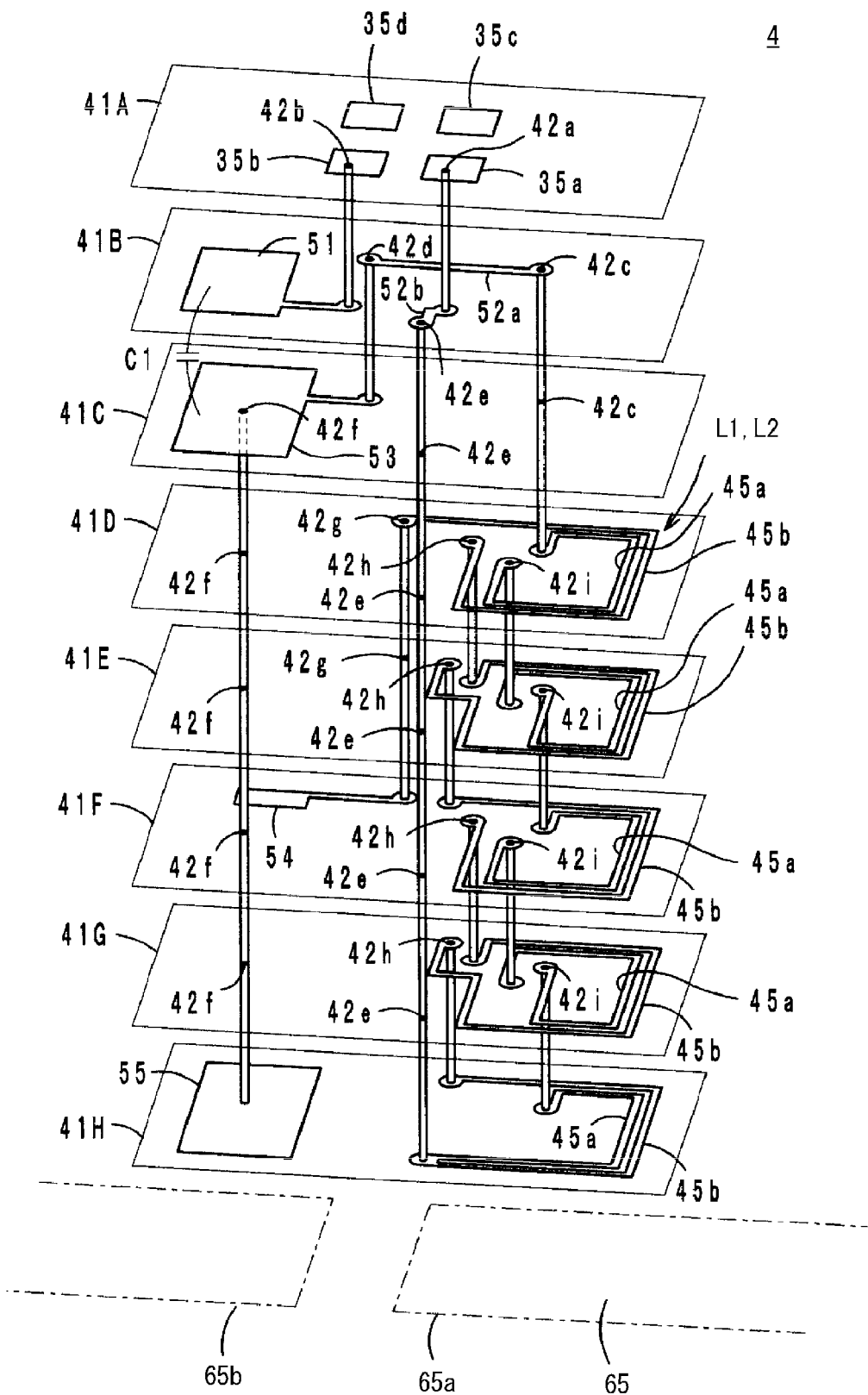
FIG. 11 is an exploded view of the internal configuration of a power supply circuit substrate of an electromagnetic coupling module.

FIG. 11 is an exploded view that shows the configuration of the inside of the power supply circuit substrate 4. The power supply circuit substrate 4 includes a multilayer substrate formed by laminating a plurality of dielectric layers in which electrode patterns are respectively provided. Wireless IC chip mounting lands 35a to 35d are provided on the uppermost dielectric layer 41A. A capacitor electrode 51 that is electrically connected to the wireless IC chip mounting land 35b is provided on the dielectric layer 41B. A capacitor electrode 53 is provided on the dielectric layer 41C and defines a capacitor C1 with the capacitor electrode 51. Inductor electrodes 45a and 45b are provided on each of the dielectric layers 41D to 41H. The inductor electrodes 45a and 45b provided in the plurality of layers form a spiral shape, and define inductors L1 and L2 that are strongly inductively coupled to each other. In addition, a capacitor electrode 54 is provided on the dielectric layer 41F and is electrically connected to the inductor L1. The capacitor electrode 54 is arranged between the two capacitor electrodes 53 and 55 to define a capacitor. In addition, a capacitor electrode 55 is provided on the dielectric layer 41H and is electrically connected to the capacitor electrode 53. Via holes 42a to 42i are arranged to electrically connect the electrodes on different dielectric layers.

The capacitor electrode 55 faces an end 65b of the metal film, which is arranged at the cutout portion of the metal film 65 shown in FIGS. 8A and 8B. A capacitor is provided between the end 65b and the capacitor electrode 55. In addition, the inductor electrodes 45a and 45b are electromagnetically coupled to the metal film portion 65a.

Figure 12:
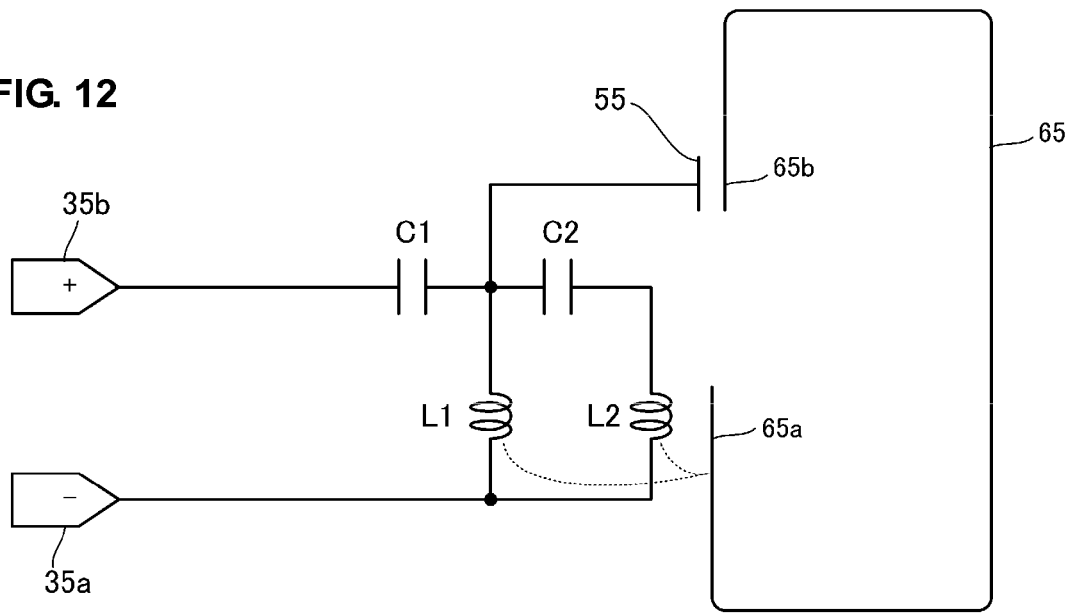
FIG. 12 is an equivalent circuit diagram that includes the power supply circuit substrate and a cutout portion of a metal film.

FIG. 12 is an equivalent circuit diagram that includes the power supply circuit substrate and the cutout portion of the metal film shown in FIG. 11. In FIG. 12, the capacitor C1 is a capacitor generated between the capacitor electrodes 51 and 53 shown in FIG. 11, the capacitor C2 is a capacitor generated between the capacitor electrode 54 and the capacitor electrodes 53 and 55 shown in FIG. 11, and the inductors L1 and L2 are provided by the inductor electrodes 45a and 45b shown in FIG. 11. The metal film 65 shown in FIG. 12 is a loop that extends along the inner peripheral edge of the cutout portion 66 shown in FIGS. 8A and 8B. The capacitor electrode 55 is capacitively coupled to one end 65b, and the other end 65a is electromagnetically coupled to the inductors L1 and L2. Thus, the loop that extends along the inner peripheral edge of the cutout portion 66 functions as a loop electrode.

Note that in the fourth preferred embodiment, the loop that extends along the inner peripheral end of the cutout portion of the metal film functions as the loop electrode. Alternatively, as shown in FIGS. 3A and 3B, it is applicable that a loop electrode is provided inside the cutout portion, and the electromagnetic coupling module 1 that includes the wireless IC chip 5 and the power supply circuit substrate 4 are mounted to the loop electrode. In this case, the loop electrode and the metal film 65 are coupled, and the metal film 65 functions as a radiator.

In the power supply circuit substrate 4, a resonant frequency is determined in a resonant circuit defined by the inductance elements L1 and L2 and its stray capacitance. The frequency of a signal radiated from the radiation electrode is substantially determined based on a self-resonant frequency of the resonant circuit.

The electromagnetic coupling module 1, which is arranged so that the wireless IC chip 5 is mounted on the power supply circuit substrate 4, receives a high-frequency signal (for example, a UHF frequency band) radiated from a reader/writer (not shown) through the radiation electrode, resonates the resonant circuit in the power supply circuit substrate 4 and then supplies only a reception signal of a predetermined frequency band to the wireless IC chip 5. On the other hand, the electromagnetic coupling module 1 extracts a predetermined amount of energy from the reception signal, matches information stored in the wireless IC chip 5 with a predetermined frequency in the resonant circuit using the extracted energy as a driving source, and then transmits the information to the radiation electrode. The information is further transmitted from the radiation electrode to the reader/writer.

In this manner, by providing the resonant circuit in the power supply circuit substrate, frequency selectivity is significantly increased. Thus, the operating frequency of the wireless IC device may be primarily determined using the self-resonant frequency. Accordingly, it is possible to exchange or transfer energy of a signal of a frequency used in an RFID system with high efficiency. In addition, it is possible to set an optimum resonant frequency corresponding to the shape and size of a radiator. This may improve the radiation characteristic of the wireless IC device.

Note that the wireless IC chip and the mounting lands of the power supply circuit substrate may be electrically connected or capacitively coupled through insulation.

In addition, by providing the matching circuit in the power supply circuit substrate, it is possible to exchange energy of a signal of a frequency used in an RFID system with high efficiency.

Seventh Preferred Embodiment

Figure 13:
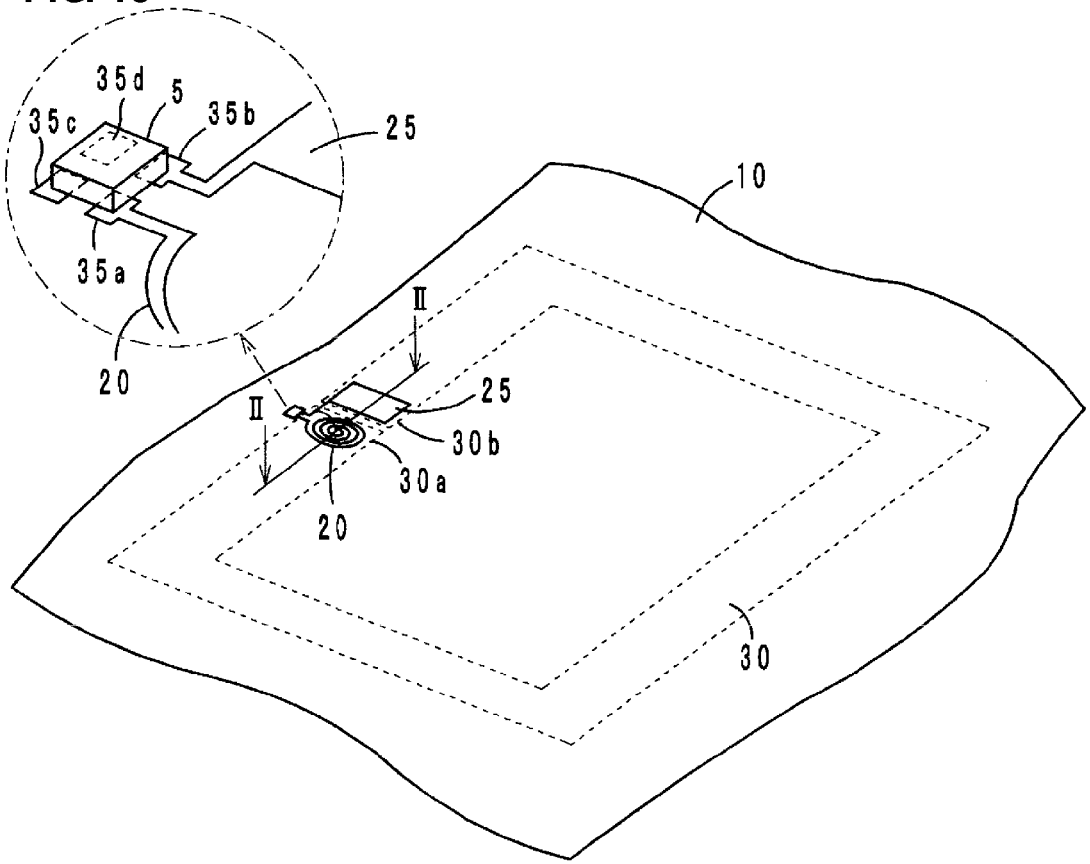
FIG. 13 is a view that shows the configuration of a wireless IC device according to a seventh preferred embodiment of the present invention and the configuration of an article provided with the wireless IC device.
Figure 14:
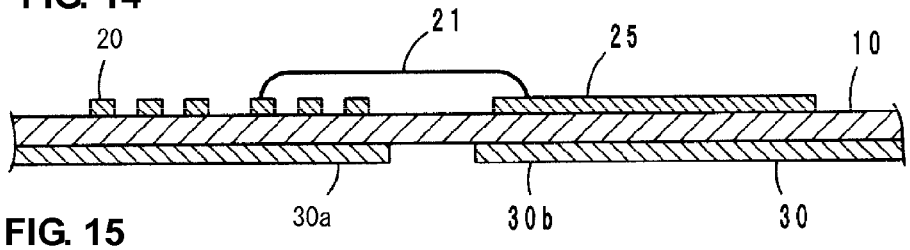
FIG. 14 is a cross-sectional view of a main portion of the wireless IC device.

FIG. 13 is a perspective view that shows the configuration of a main portion of a wireless IC device according to a seventh preferred embodiment of the present invention. FIG. 14 is an enlarged partially cross-sectional view of FIG. 13.

In FIG. 13, a base material 10 is the base material of an article for which the wireless IC device is provided and is preferably, for example, an aluminum-deposited laminated film. On the aluminum-deposited layer of the base material 10, a loop electrode 30 that is open at the cutout portion described in the first preferred embodiment or in a predetermined portion of the non-conductive portion described in the second preferred embodiment. An inductor electrode 20 and a capacitor electrode 25 are disposed above the open two ends 30a and 30b via an insulating layer. The inductor electrode 20 has a substantially spiral shape and, as will be described below, the inside end is connected to the capacitor electrode 25.

The wireless IC chip 5 is mounted at the ends of the inductor electrode 20 and capacitor electrode 25, as shown in the enlarged view in FIG. 13. That is, the wireless IC chip mounting land 35a is provided at the end of the inductor electrode 20 and the wireless IC chip mounting land 35b is provided at the end of the capacitor electrode 25, and, furthermore, the mounting lands 35c and 35d are provided. Then, the wireless IC chip 5 is mounted.

FIG. 14 is a cross-sectional view that is taken along the line II-II in FIG. 13. As shown in FIG. 14, the inductor electrode 20 faces the end 30a of the loop electrode. A wire 21 connects the inside end of the inductor electrode 20 shown in FIG. 13 to the capacitor electrode 25.

In this manner, capacitors and inductors arranged to match the impedance and adjust the resonant frequency may be provided on the side of the base material 10 of an article, and the wireless IC chip 5 may be directly mounted.

Eighth Preferred Embodiment

Figure 15:
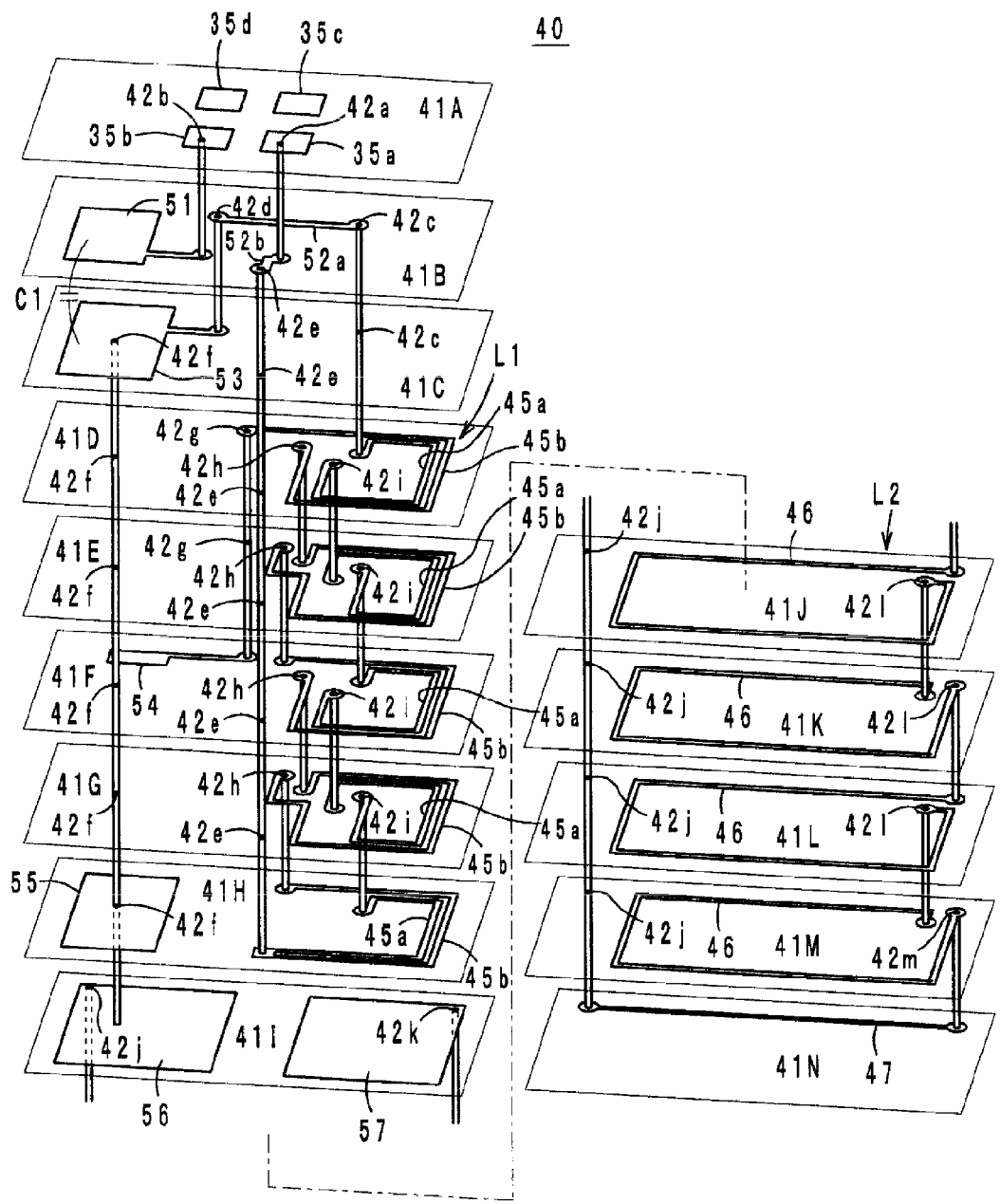
FIG. 15 is an exploded perspective view of a power supply circuit substrate of a wireless IC device according to an eighth preferred embodiment of the present invention.
Figure 16:
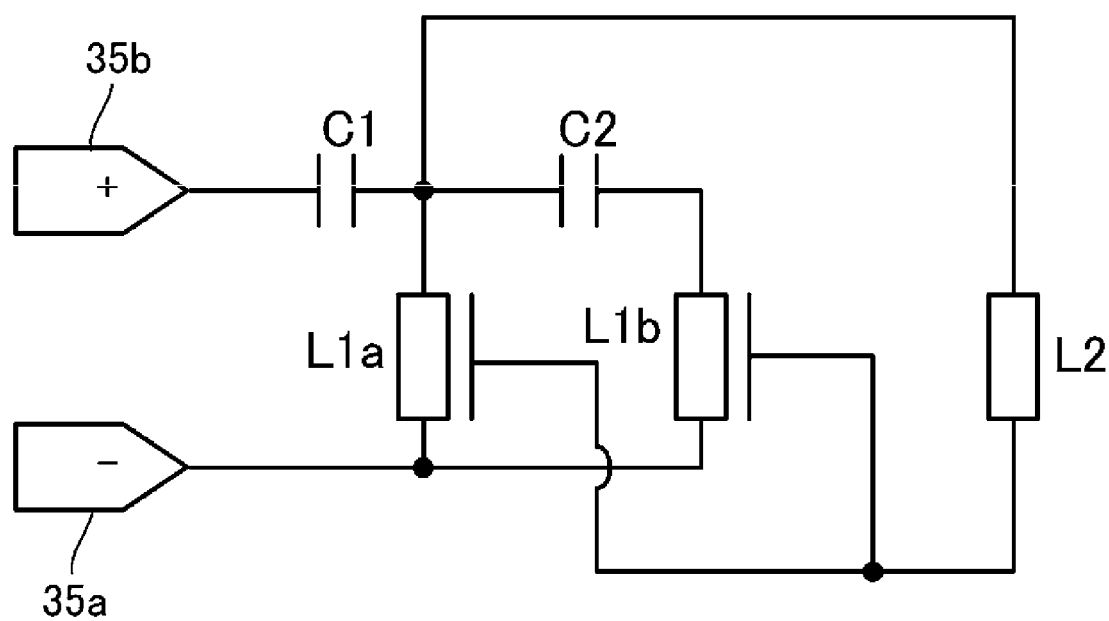
FIG. 16 is an equivalent circuit diagram of a main portion of the wireless IC device.

FIG. 15 is an exploded perspective view of a power supply circuit substrate 40 of a wireless IC device according to an eighth preferred embodiment of the present invention. In addition, FIG. 16 is an equivalent circuit diagram thereof.

The power supply circuit substrate 40 includes a multilayer substrate formed by laminating a plurality of dielectric layers in which electrode patterns are respectively provided. Wireless IC chip mounting lands 35a to 35d are provided on the uppermost dielectric layer 41A. A capacitor electrode 51 that is electrically connected to the wireless IC chip mounting land 35b is provided on the dielectric layer 41B. A capacitor electrode 53 is provided on the dielectric layer 41C and defines a capacitor C1 with the capacitor electrode 51. Inductor electrodes 45a and 45b are provided on each of the dielectric layers 41D to 41H. The inductor electrodes 45a and 45b provided on these layers define an inductor L1 that has a substantially spiral shape. In addition, a capacitor electrode 54 is provided on the dielectric layer 41F and is electrically connected to the inductor L1. The capacitor electrode 54 is disposed between the two capacitor electrodes 53 and 55 (or 56) to define a capacitor. In addition, a capacitor electrode 55 is provided on the dielectric layer 41H and is electrically connected to the capacitor electrode 53.

Capacitor electrodes 56 and 57 are provided on a dielectric layer 41I. The capacitor electrode 56 is electrically connected to the capacitor electrodes 53 and 55. In addition, the capacitor electrode 57 is electromagnetically coupled to the inductor electrodes 45a and 45b.

Inductor electrodes 46 and 47 are provided on each of dielectric layers 41J to 41N. The inductor electrodes 46 and 47 define a loop electrode L2 that is preferably wound multiple times. Via holes 42a to 42m are arranged to electrically connect the electrodes of the different dielectric layers.

That is, the power supply circuit substrate 40 is configured such that the loop electrode is included in the power supply circuit substrate 4 shown in FIG. 11. Thus, by providing the electromagnetic coupling module, which is formed by mounting the wireless IC chip on the power supply circuit substrate 40, to an article, the wireless IC device may be provided, and it is not necessary to provide a loop electrode on the article side.

In FIG. 16, the capacitor C1 is a capacitor generated between the capacitor electrodes 51 and 53 shown in FIG. 15, the capacitor C2 is a capacitor generated between the capacitor electrode 54 and the capacitor electrodes 53 and 55 shown in FIG. 15, the inductors L1a and L1b are respectively defined by the inductor electrodes 45a and 45b shown in FIG. 15, and the inductor L2 is defined by the inductor electrodes 46 and 47 shown in FIG. 15.

Ninth Preferred Embodiment

Figure 17A:
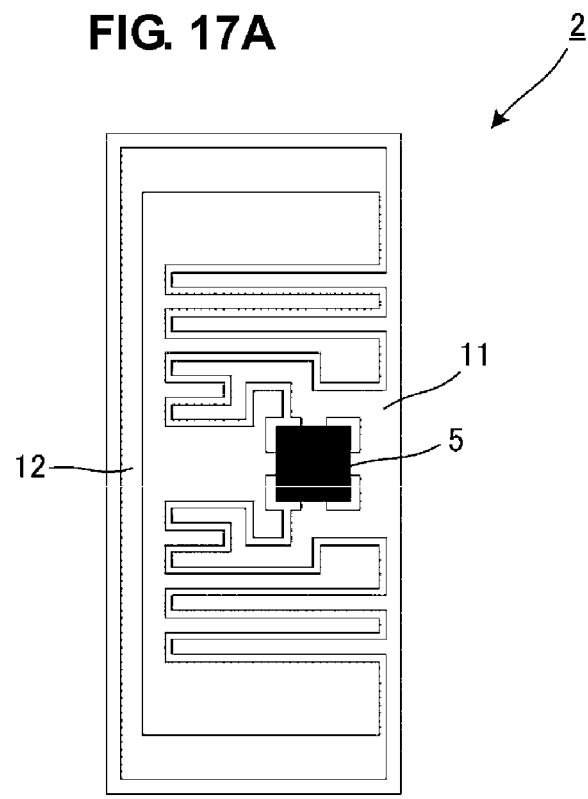
FIGS. 17A and 17B are plan views of an electromagnetic coupling module used for a wireless IC device according to a ninth preferred embodiment of the present invention.
Figure 17B:
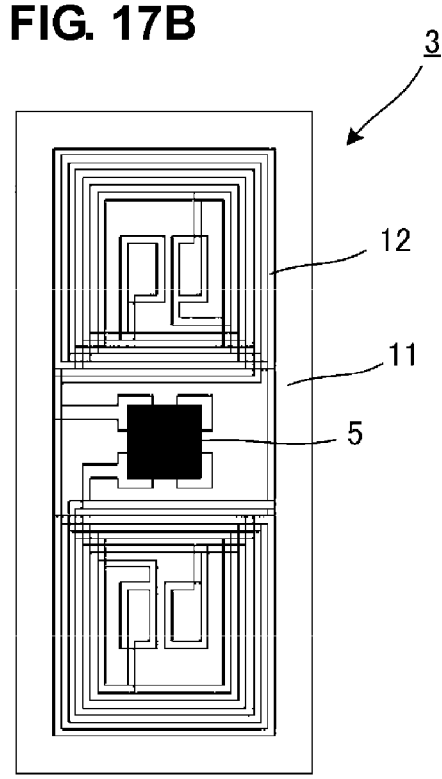

FIGS. 17A and 17B are plan views of an electromagnetic coupling module used for a wireless IC device according to a ninth preferred embodiment of the present invention. In FIG. 17A, a loop electrode 12 and wireless IC chip mounting lands are provided on the substrate 11 by an electrode pattern, and the wireless IC chip 5 is mounted.

In the eighth preferred embodiment shown in FIG. 15, the capacitors and inductors arranged to match impedance and adjust resonant frequency are provided on the power supply circuit substrate together with the loop electrode, whereas in the ninth preferred embodiment shown in FIGS. 17A and 17B, the loop electrode and the wireless IC chip are integrated.

As shown in FIG. 17B, spiral electrode patterns are respectively provided on the top and bottom surfaces of the substrate 11, capacitor electrodes provided on the top and bottom surfaces of the substrate 11 are arranged at the approximate center of each of the spiral electrode pattern, and then the line on the top surface and the line on the bottom surface are connected via the capacitors. That is, the desired line length and inductance are obtained within a limited area by utilizing both surfaces of the substrate 11 to thereby define the loop electrode 12.

Two electromagnetic coupling modules 2 and 3 shown in FIGS. 17A and 17B are each arranged adjacent to a metal film of an article, which functions as a radiator, or a metal plate such that the radiation electrode is capacitively coupled to the loop electrode 12. With this configuration, it is possible to utilize the metal film of the article or the metal plate as a radiator of an antenna without providing any specific circuit on the article side, as in the case of the first and second preferred embodiments.

Tenth Preferred Embodiment

Figure 18A:
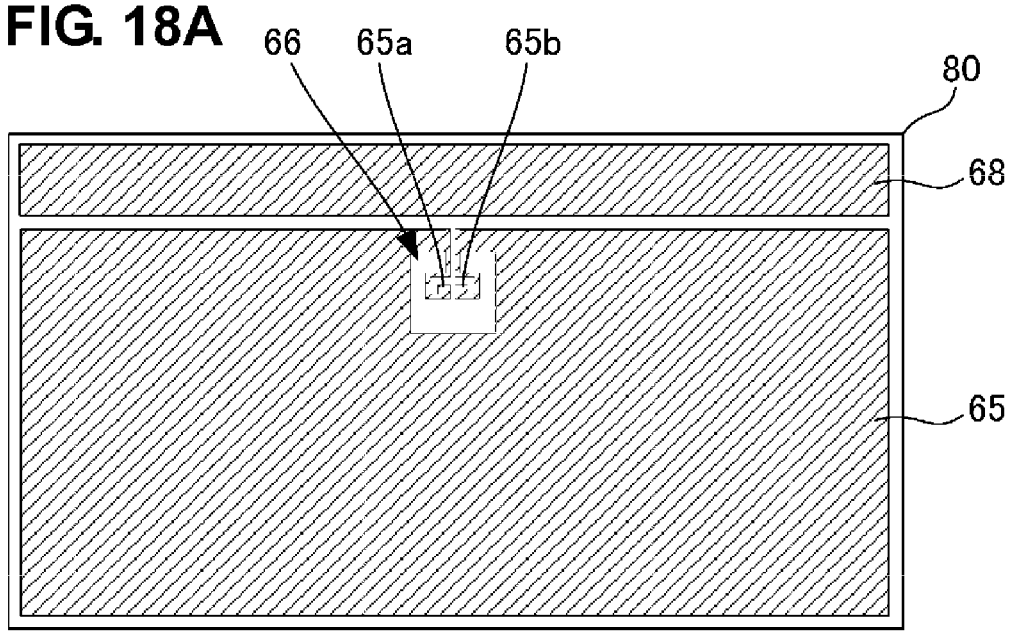
FIGS. 18A and 18B are views that show the configuration of a wireless IC device according to a tenth preferred embodiment of the present invention.
Figure 18B:
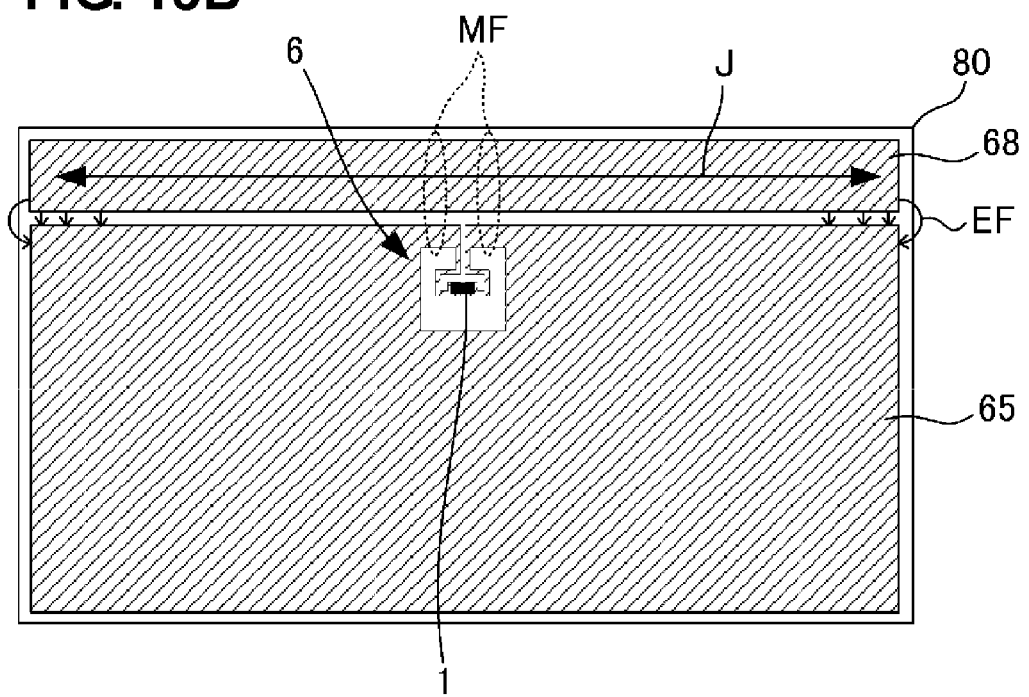

FIGS. 18A and 18B are views that show the configuration of a wireless IC device according to a tenth preferred embodiment of the present invention. In the first to ninth preferred embodiments, the article package 60, the metal substantially planar body 63, and the metal film 65, in which a conductive member extends in a substantially planar manner, function as a radiator, whereas in the tenth preferred embodiment, a resonant conductor that is insulated from a planar conductive member and that functions as a resonator is provided.

FIG. 18A is a plan view of a conductive pattern on a printed wiring substrate when an RFID tag is provided on the printed wiring substrate. In addition, FIG. 18B is a plan view of a wireless IC device that functions as an RFID tag, which is configured so that the electromagnetic coupling module 1 including a wireless IC chip and a power supply circuit substrate is mounted on the printed wiring substrate.

A metal film 65, which is used as a ground electrode of another circuit, is provided on the upper surface of the printed wiring substrate 80. The metal film 65 partially defines a cutout portion (metal film non-formation portion) 66, and the metal film portions 65a and 65b, which define a mounting portion for a high-frequency device (electromagnetic coupling module or wireless IC chip), are provided in the cutout portion 66.

As shown in FIG. 18B, by mounting the high-frequency device 1 on the metal film portions 65a and 65b, the portion that extends along the inner peripheral edge of the cutout portion 66 functions as a loop electrode. The mounting area of the high-frequency device 1 defines a main portion 6 of the wireless IC device.

A resonant conductor 68 that is coupled to the high-frequency device 1 is provided on the upper surface of the printed wiring substrate 80. The resonant conductor 68 has determined dimensions (particularly, length) such that the resonant frequency is a frequency used in an RFID tag or a frequency thereabout. For example, when a glass epoxy substrate is used and the operating frequency is a UHF band, the length of the resonant conductor 68 needs to be only several tens of centimeters so as to operate as a both-end-open half-wavelength resonator.

The resonant conductor 68 is arranged so that the approximate center is located adjacent to the loop electrode of the main portion 6 of the wireless IC device, so as to be coupled to the high-frequency device 1. In addition, in this preferred embodiment, the resonant conductor 68 is arranged along one side of the metal film 65 in an insulated manner.

In FIG. 18B, the arrow J shown in the resonant conductor 68 typically represents an electric current path, the arrow EF typically represents an electric field distribution, and the arrow MF typically represents a magnetic field distribution. In this manner, the magnitude of an electric current that flows through the resonant conductor 68 is at a maximum around the approximate center. Thus, the magnetic field generated at the resonant conductor 68 is at a maximum around the approximate center, and the resonant conductor 68 is strongly magnetically coupled to the portion of the loop electrode, extending along the inner peripheral edge of the cutout portion 66.

When the resonant conductor 68 is resonated in the vicinity of the operating frequency of the RFID tag, an electric current that flows through the resonant conductor 68 and a voltage generated across both ends of the resonant conductor 68 increases. Due to the magnetic field and electric field generated by the electric current and a voltage, the resonant conductor 68 is coupled to the metal film 65.

The peak of a voltage of a standing wave generated at the resonant conductor 68 is provided at an end of the resonant conductor 68. In this preferred embodiment, because the length of the resonant conductor 68 is substantially equal to one end of the metal film 65 that functions as a radiator, the resonant conductor 68 is strongly coupled to the metal film 65. Thus, a high gain is obtained. With the arrangement described above, it is possible to obtain an excellent characteristic as an RFID tag.

When no resonant conductor 68 is provided, resonance needs to be performed only in the metal film 65 at the operating frequency of an RFID tag. However, due to restrictions on the size of the metal film 65 and depending on the components mounted on the printed wiring substrate, the resonant frequency shifts. According to the present preferred embodiment, because the metal film 65 is separated from the resonant conductor 68, the resonant conductor 68 may be designed as a single unit, and a shift in resonant frequency due to mounted components does not occur.

Note that in the tenth preferred embodiment, only the metal film, as a ground electrode, and the resonant conductor are described as an electrode pattern provided on the printed wiring substrate. However, an electrode pattern is appropriately determined based on a circuit to be formed and an electronic component to be mounted. This also applies to other preferred embodiments described below.

When an RFID tag is provided on the above-described printed wiring substrate, and information such as manufacturing process history is written to the RFID tag, it is possible to manage, for example, a process of mounting components to a printed wiring substrate. For example, when a malfunction of an electronic component is detected in a lot, it is possible to withdraw only a small number of electronic devices that have the malfunctioning electronic component included in that lot. In addition, post-sales support and maintenance when the product is in operation in the market may be quickly performed, and recycling of the resource after disposal will be simplified.

In addition, after process management has ended, a portion of the printed wiring substrate, defining the resonant conductor 68, may be removed. By so doing, the size of the printed wiring substrate may be reduced, and it is possible to reduce the size of a product without losing the function of an RFID tag. Because the resonant conductor 68 is present at the time of process management, data may be read even when the output level of a reader/writer is relatively low. By lowering the output of an RF signal, it is possible to suppress a malfunction of a control device, a characteristic measurement device, and other suitable device. Furthermore, after the resonant conductor 68 is removed, the metal film 65 also functions as a radiator. Thus, communication is still possible although the communicable distance with a reader/writer is reduced.

When the printed wiring substrate is conveyed in a general manufacturing process, rails may be arranged on both sides of the printed wiring substrate and then the printed wiring substrate may be conveyed on the rails. In order to prevent breakage of the portions that contact the rails, the printed wiring substrate has a margin portion that will be removed. If the resonant conductor 68 is provided at the margin portion, wasted space of the printed wiring substrate is significantly reduced.

Note that the metal film 65, which is a ground electrode, may be provided in a plurality of layers of the printed wiring substrate. In this case, the region of the cutout portion 66 in each layer is provided as a metal film non-formation portion so that a magnetic flux passes therethrough.

According to this preferred embodiment, a radiation gain at the operating frequency of an RFID tag increases and outstanding characteristics of an RFID are obtained. In addition, because the resonant frequency of the resonant conductor is not influenced by components mounted on the printed wiring substrate, the design is facilitated.

Eleventh Preferred Embodiment

FIG. 19A to FIG. 21B are views that show some configurations of a wireless IC device according to an eleventh preferred embodiment of the present invention. Each of FIGS. 19A to 21B is a plan view of a wireless IC device such that an RFID tag is provided on a printed wiring substrate.

Figure 19A:
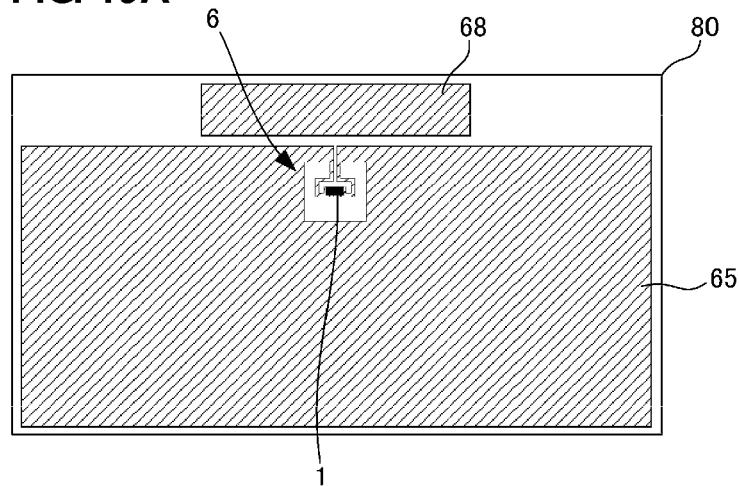
FIGS. 19A and 19B are views that show configurations of a wireless IC device according to an eleventh preferred embodiment of the present invention.
Figure 19B:
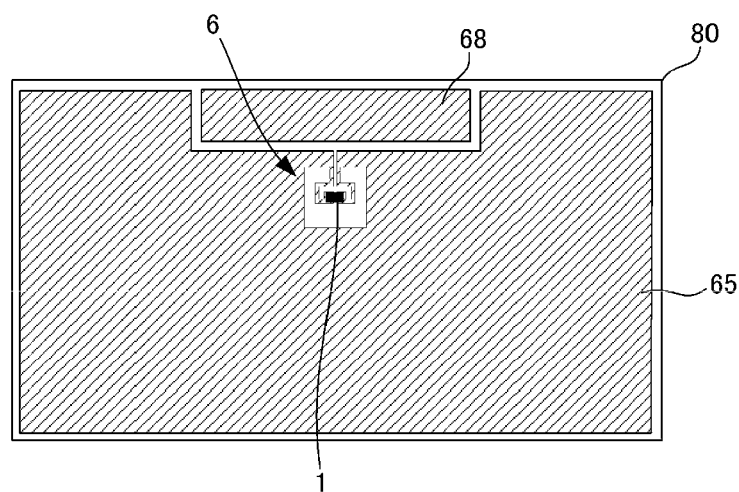

In the examples shown in FIGS. 19A and 19B, the metal film 65, which is used as a ground electrode for another circuit, is provided on the upper surface of the printed wiring substrate 80. The metal film 65 partially defines a cutout portion (metal film non-formation portion), and a high-frequency device (electromagnetic coupling module or wireless IC chip) is mounted inside the cutout portion, so that the main portion 6 of the wireless IC device similar to that shown in FIGS. 18A and 18B is provided.

The configuration differs from the configuration shown in FIGS. 18A and 18B in that the length of the resonant conductor 68 is less than that of one side of the metal film 65 defining a radiator. In the example of FIG. 19A, the resonant conductor 68 is provided along one side of the metal film 65. In the example of FIG. 19B, the resonant conductor 68 is provided at a location that is separated from an area in which the metal film 65 is provided.

Even with the above-described relationship, when the printed wiring substrate 80 and the metal film 65 have relatively large areas and a resonance frequency caused by the metal film 65 is relatively low, the resonant frequency of the resonant conductor 68 may be set to be in the vicinity of the operating frequency of an RFID. Thus, a high gain is obtained.

Figure 20:
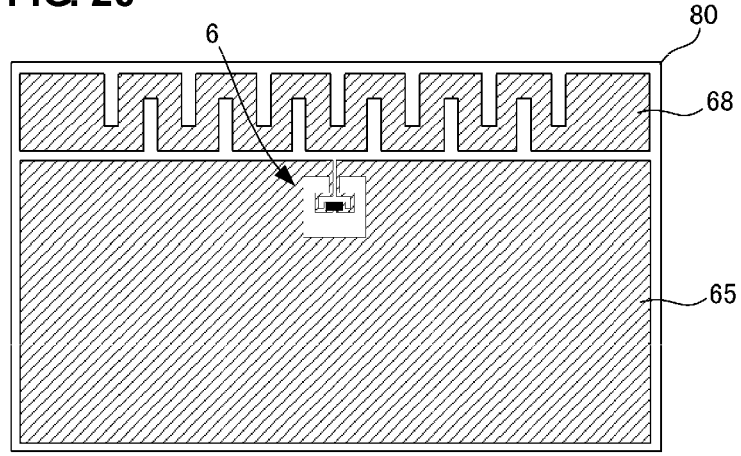
FIG. 20 is a view that shows the configuration of another wireless IC device according to the eleventh preferred embodiment of the present invention.

As shown in FIG. 20, the resonant conductor 68 has a meandering line shape and the entire resonant conductor 68 is arranged along one side of the metal film 65.

According to the above-described configuration, because the resonator length may be increased even when the profile of the resonant conductor 68 is relatively short, a high gain may be obtained when it is resonated at a relatively low frequency.

Figure 21A:
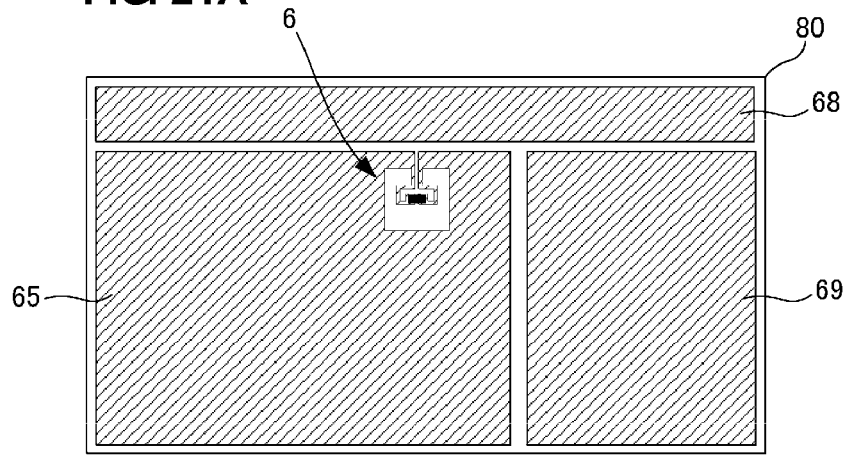
FIGS. 21A and 21B are views that show configurations of another wireless IC device according to the eleventh preferred embodiment of the present invention.
Figure 21B:
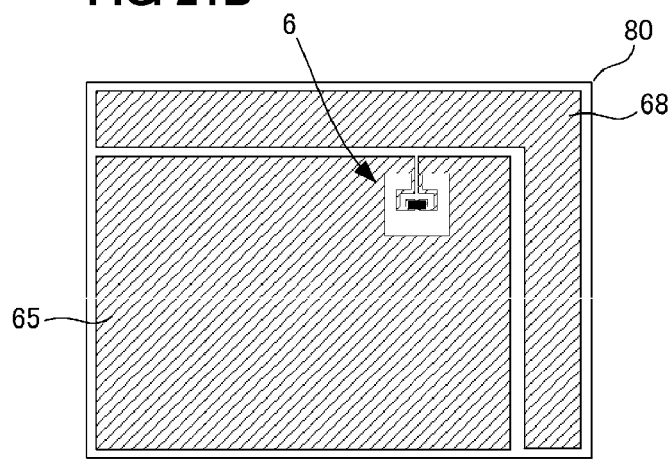

As shown in FIGS. 21A and 21B, the resonant conductor 68 is longer than one side of the metal film 65 that functions as a radiator. In addition, a main portion 6 of the wireless IC device is disposed at a location shifted from the approximate center of one side of the metal film 65 that functions as a radiator. In this case, as shown in FIGS. 21A and 21B, the approximate center of the resonant conductor 68 must be arranged adjacent to the loop electrode of the main portion 6 of the wireless IC device.

As shown in FIG. 21A, a metal film 69 arranged to provide another ground electrode or another circuit is provided in a margin at a location adjacent to the metal film 65. In addition, as shown in FIG. 21B, the resonant conductor 68 is arranged along two sides of the metal film 65.

In this manner, even when the pattern of the metal film 65 that functions as a radiator is relatively small, a high gain is obtained by providing the resonant conductor 68 having a length that provides a necessary resonant frequency.

Twelfth Preferred Embodiment

Figure 22:
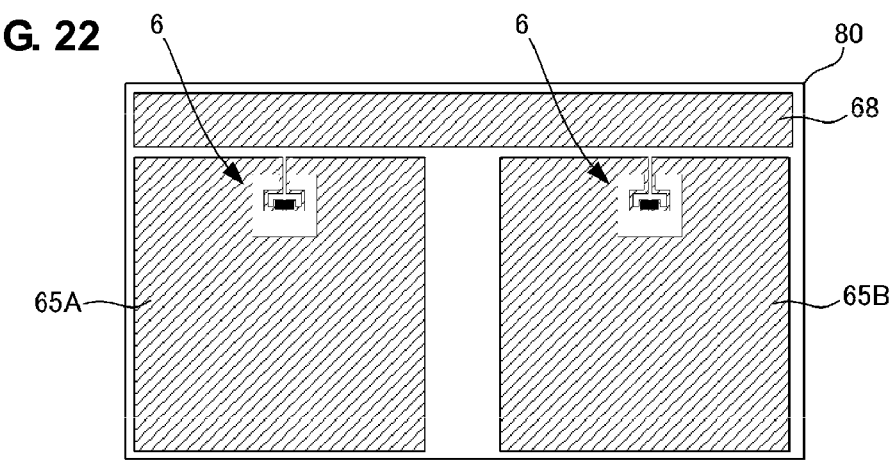
FIG. 22 is a view that shows the configuration of a wireless IC device according to a twelfth preferred embodiment of the present invention.

FIG. 22 is a view that shows the configuration of a wireless IC device according to a twelfth preferred embodiment of the present invention. In FIG. 22, the main portion 6 of the wireless IC device similar to that shown in FIG. 18 is provided in each of two metal films 65A and 65B on the upper surface of a printed wiring substrate 80. Then, a resonant conductor 68 is arranged so as to be coupled to both high-frequency devices provided at the main portions 6 of the two wireless IC devices. That is, one resonant conductor 68 is preferably shared by two high-frequency devices.

For example, the printed wiring substrate 80 may include RFID tags having different frequency bands (for example, even in the same UHF band, a standard frequency in accordance with a destination) by being separated into the side at which a metal film 65A is provided and the side at which a metal film 65B is provided.

When the resonant conductor 68 is longer than one side of the metal film 65 that functions as a radiator, the resonant conductor 68 may preferably be easily shared as a resonator for a plurality of high-frequency devices as described above. In addition, even when shared frequencies are different, the resonant frequency merely needs to be set to a frequency approximate the same as the frequencies used in the plurality of RFID tags.

When the resonant conductor 68 is used only in the manufacturing process, it will later be separated from the printed wiring substrate 80. Thus, the mother printed wiring substrate does not have the wasted space of an electrode pattern, and it is possible to prevent an increase in the cost due to the inclusion of the resonant conductor 68.

Thirteenth Preferred Embodiment

Figure 23A:
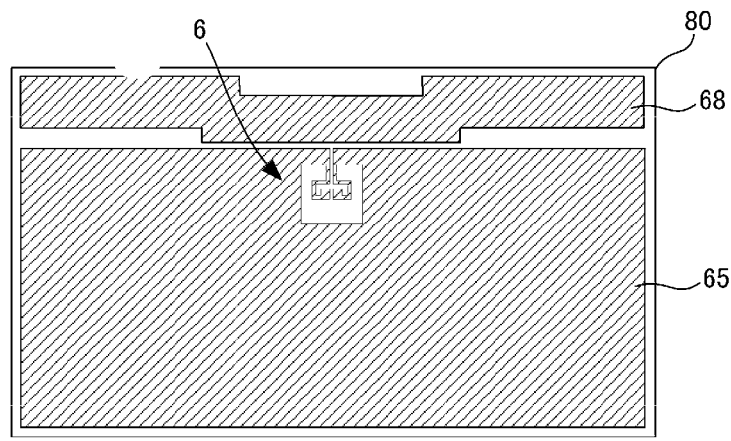
FIGS. 23A and 23B are views that show configurations of a wireless IC device according to a thirteenth preferred embodiment of the present invention.
Figure 23B:
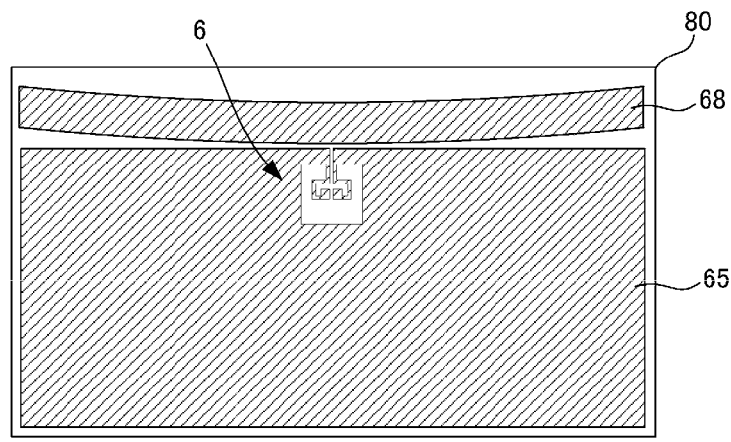

FIGS. 23A and 23B are views that show some configurations of a wireless IC device according to a thirteenth preferred embodiment of the present invention. FIGS. 23A and 23B are plan views of a wireless IC device in which an RFID tag is provided on a printed wiring substrate.

As shown in FIGS. 23A and 23B, the metal film 65, which is used as a ground electrode for another circuit, is provided on the upper surface of the printed wiring substrate 80. A main portion 6 of the wireless IC device similar to that shown in FIGS. 18A and 18B is provided at a portion of the metal film 65.

The configuration differs from the configuration shown in FIGS. 18A and 18B in that only a portion in the vicinity of the approximate center of the resonant conductor 68 is arranged adjacent to the loop electrode of the main portion 6 of the wireless IC device. Depending on the relationship between the length of one side of the metal film 65 that functions as a radiator and the length of the resonant conductor 68, portions near both ends of the resonant conductor 68 may be arranged in a shape so as to be located away from the metal film 65 as described above.

Fourteenth Preferred Embodiment

Figure 24:
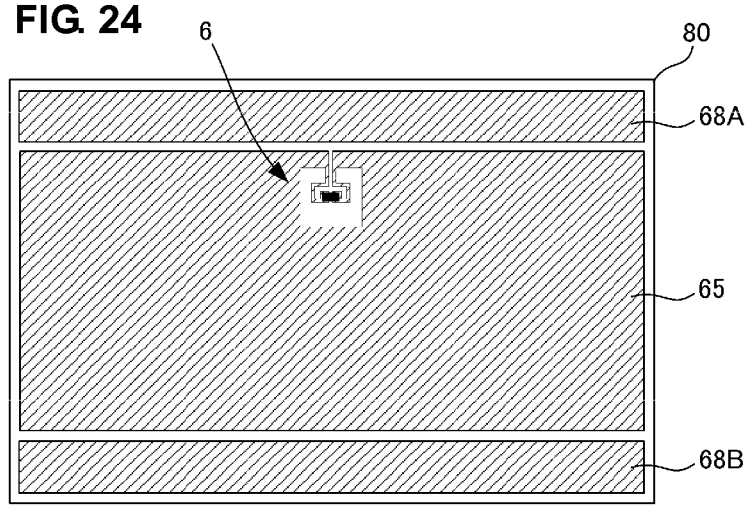
FIG. 24 is a plan view that shows the configuration of a wireless IC device according to a fourteenth preferred embodiment of the present invention.

FIG. 24 is a plan view that shows the configuration of a wireless IC device according to a fourteenth preferred embodiment of the present invention. The configuration differs from the configuration shown in FIGS. 18A and 18B in that resonant conductors 68A and 68B are respectively arranged along two sides of the metal film 65.

One resonant conductor 68A is strongly coupled to a high-frequency device provided at the main portion 6 of the wireless IC device. The other resonant conductor 68B is located adjacently along the metal film 65. Thus, the other resonant conductor 68B is coupled to the high-frequency device via an electromagnetic field distributed in the metal film 65. Both of the resonant conductors 68A and 68B operate as a two-end-open half-wavelength resonator.

The plurality of resonant conductors 68 are not limited to being arranged along two opposite sides of the metal film 65, and may be arranged along sides of the metal film 65, which are substantially perpendicular to each other.

Fifteenth Preferred Embodiment

Figure 25:
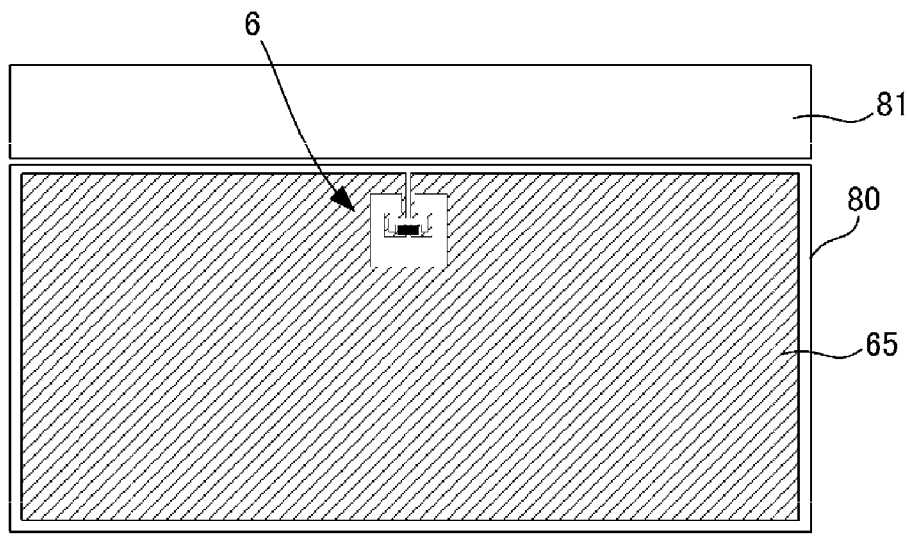
FIG. 25 is a plan view that shows the configuration of a wireless IC device according to a fifteenth preferred embodiment of the present invention.

FIG. 25 is a plan view that shows the configuration of a wireless IC device according to a fifteenth preferred embodiment of the present invention. In the tenth to fourteenth preferred embodiments, the resonant conductor is provided on the printed wiring substrate, whereas in the fifteenth preferred embodiment, a metal case of a device, on which the wireless IC device is mounted, or a mounting destination component 81, such as a mounting component, defines the resonant conductor.

With the above-described configuration, the metal case of the device, on which the wireless IC device is mounted, the mounting component, or other suitable component, functions as a resonator. Thus, it is not necessary to provide a resonant conductor on the printed wiring substrate. This can reduce the size of the printed wiring substrate 80 and thus, the cost may be reduced.

Sixteenth Preferred Embodiment

In the sixteenth preferred embodiment, a resonant conductor is fixed, and at the time when a printed wiring substrate is conveyed along a process line, the printed wiring substrate communicates with a reader/writer.

Figure 26:
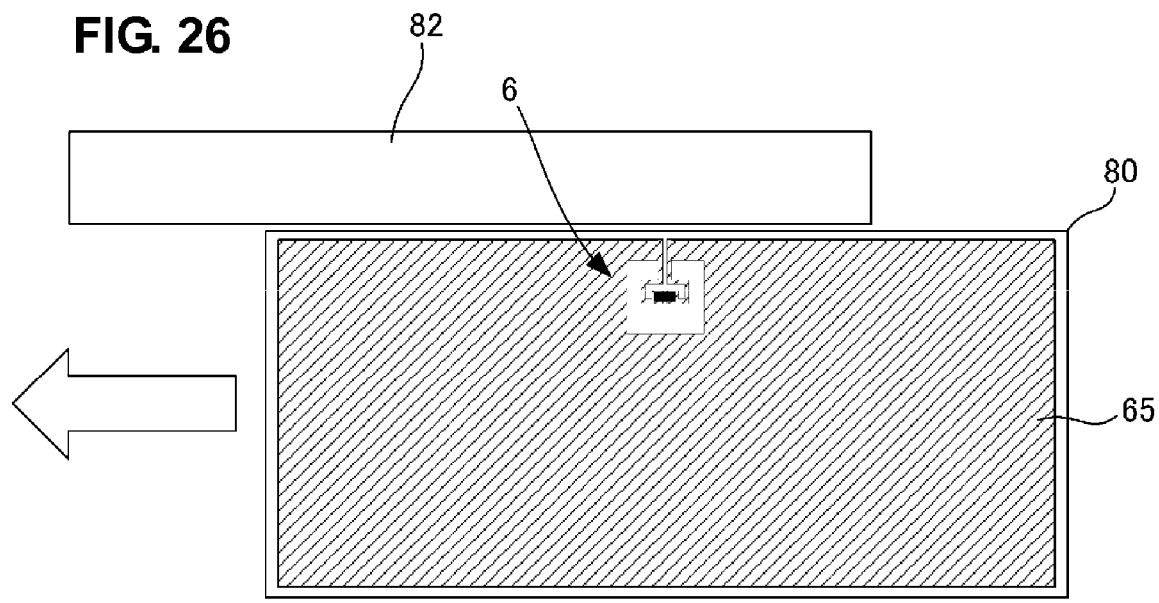
FIG. 26 is a plan view that shows the configuration of a wireless IC device according to a sixteenth preferred embodiment of the present invention.

FIG. 26 is a plan view that shows the configuration of a wireless IC device according to the sixteenth preferred embodiment of the present invention. In FIG. 26, a process line installed conductor 82 is arranged along the process line along which the printed wiring substrate 65 is conveyed. The reader/writer is arranged at a location relatively close to the process line installed conductor 82 (but not necessarily adjacent thereto).

A main portion 6 of a wireless IC device similar to that shown in FIGS. 18A and 18B is provided on the metal film 65 of the printed wiring substrate 80.

When the printed wiring substrate 80 is conveyed along the process line and the main portion 6 of the wireless IC device is located adjacent to the process line installed conductor 82, the process line installed conductor 82 functions as a resonator that resonates at the frequency of an RFID tag. Thus, it is possible to communicate with the reader/writer with a high gain in this state.

According to the above-described configuration and communication method, because no resonant conductor is required on the printed wiring substrate, the area of a wirable portion increases. In addition, because it operates as an RFID tag only when the printed wiring substrate 80 is located close to the process line installed conductor 82, it is possible to communicate only with an RFID tag disposed at a specific location. That is, it is possible to selectively communicate only with a desired RFID tag without communicating with an unintended RFID tag.

Seventeenth Preferred Embodiment

Figure 27A:
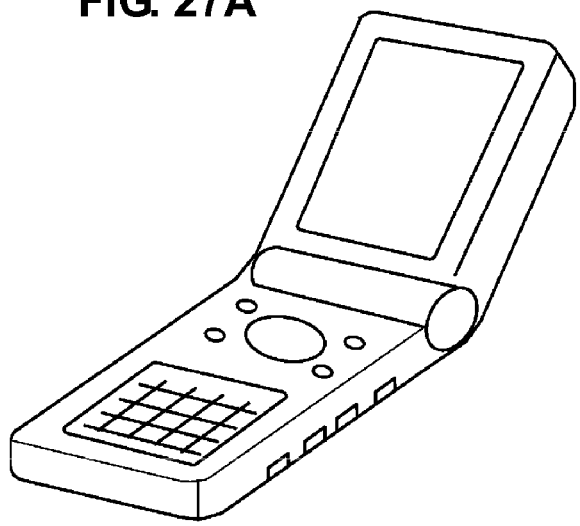
FIGS. 27A and 27B is a perspective view of a cellular phone terminal provided with a wireless IC device according to a seventeenth preferred embodiment of the present invention and a cross-sectional view of a main portion of an internal circuit substrate.
Figure 27B:
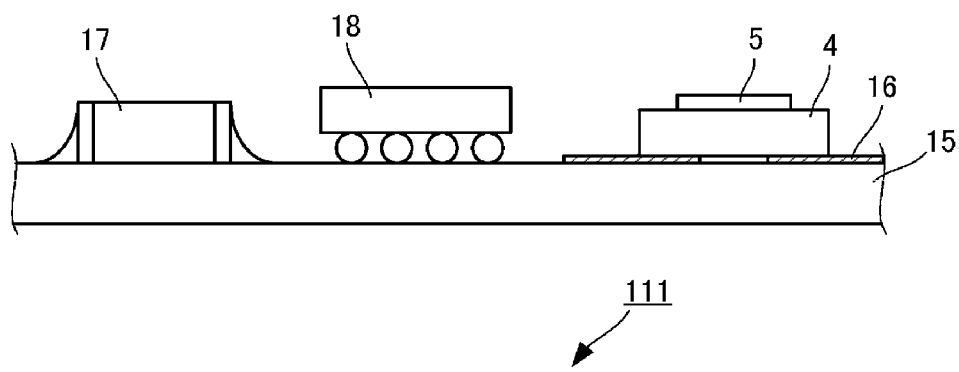

FIG. 27A is a perspective view of a cellular phone terminal provided with a wireless IC device, and FIG. 27B is a cross-sectional view of a main portion of an internal circuit substrate. The power supply circuit substrate 4, on which the wireless IC chip 5 is mounted, is installed on the circuit substrate 15 inside a cellular phone terminal, together with electronic components 17 and 18. An electrode pattern 16 that spreads in a predetermined area is provided on the upper surface of the circuit substrate 15. The electrode pattern 16 is coupled to the wireless IC chip 5 via the power supply circuit substrate 4 so as to function as a radiator.

Alternatively, a wireless IC device may preferably be provided at a metal panel provided at the rear surface of an internal component (for example, the liquid crystal panel) of the cellular phone terminal shown in FIG. 27A. That is, the metal panel may function as a radiator of an antenna by applying the wireless IC device shown in the first to seventh preferred embodiments.

Note that it may be similarly applied to any articles having a conductive portion with a predetermined area, other than the above described preferred embodiments. For example, it may also be applied to a medicine or snack packages having a composite film including aluminum foil, such as a press through package (PTP).

Eighteenth Preferred Embodiment

In the preferred embodiment shown in FIG. 9A, the metal film 65 that functions as a radiator is formed of a sheet material or a plate material, and the metal film 65 partially defines the cutout portion 66, so that the portion extending along the inner peripheral edge of the cutout portion 66 defines the loop electrode. When the above-described configuration is applied to the printed wiring substrate, a characteristic as an RFID tag varies depending on a circuit provided on the printed wiring substrate. Thus, the degree of difficulty in designing the printed wiring substrate increases. An eighteenth preferred embodiment of the present invention eliminates this problem.

Figure 28:
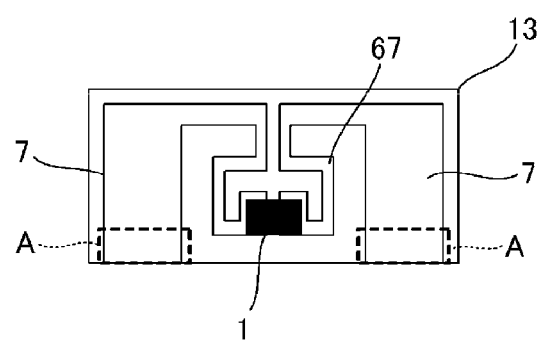
FIG. 28 is a plan view that shows the configuration of a component for a wireless IC device according to an eighteenth preferred embodiment of the present invention.

FIG. 28 is a plan view that shows the configuration of a component for a wireless IC device according to the eighteenth preferred embodiment of the present invention. A mounting portion, on which an electromagnetic coupling module 1 is mounted, a matching circuit 67, and a loop electrode 7 are provided on a printed wiring substrate 13, such as a glass epoxy substrate. The ends of the loop electrode 7 extend to an end of one side of the printed wiring substrate 13 as soldering electrode portions indicated by A. The electromagnetic coupling module 1 is mounted on the printed wiring substrate 13 to define a component 111 for a wireless IC device.

Figure 29:
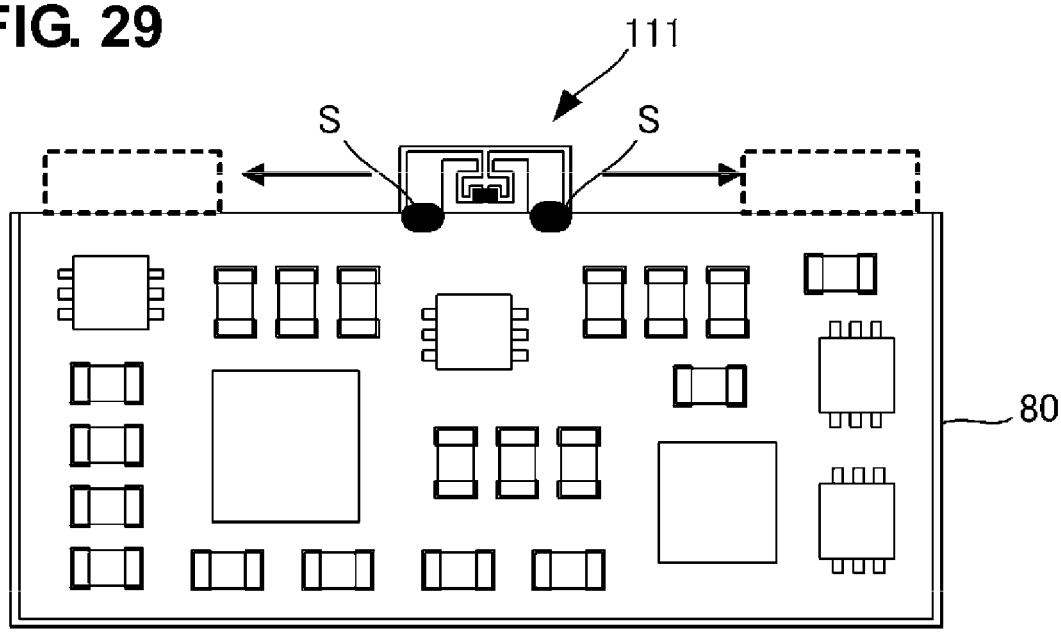
FIG. 29 is a plan view that shows a wireless IC device that uses the component for a wireless IC device according to the eighteenth preferred embodiment of the present invention.

FIG. 29 is a plan view that shows a wireless IC device that includes the component for a wireless IC device according to the eighteenth preferred embodiment. As shown in FIG. 29, the component 111 for a wireless IC device is soldered to a location at which the loop electrode of the printed wiring substrate 80 will be provided. When a resist film is coated on the electrodes of the printed wiring substrate 80, the resist film is peeled off with a router, or other suitable device, to be ready for soldering. In this state, characteristics, such as a reading distance as an RFID tag, and an influence of ambient wires, a casing, or other factors, when assembled to a device are checked.

Figure 30:
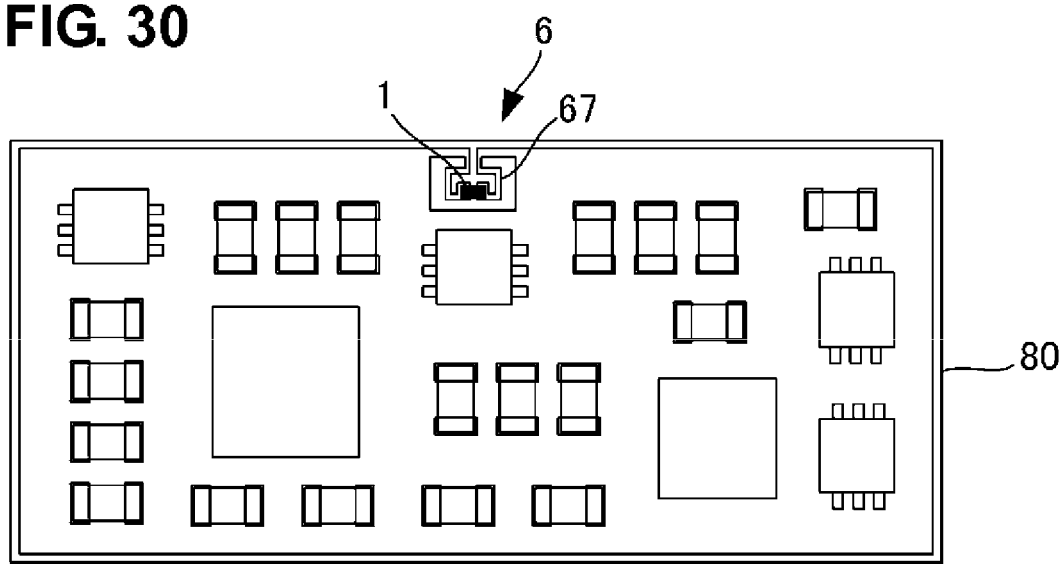
FIG. 30 is a view that shows an example in which a main portion of a wireless IC device is formed within a ground electrode formation area on a printed wiring substrate.

When an optimum location is determined based on the results of checking of the characteristics, as shown in FIG. 30, the matching circuit 67 and a mounting portion for the electromagnetic coupling module 1 are provided at a location in the vicinity of a location at which the component 111 for a wireless IC device is assembled, within a ground electrode formation area on the printed wiring substrate 80, and then the electromagnetic coupling module 1 is mounted. By so doing, the main portion 6 of the wireless IC device is provided on the printed wiring substrate 80.

Nineteenth Preferred Embodiment

Figure 31A:
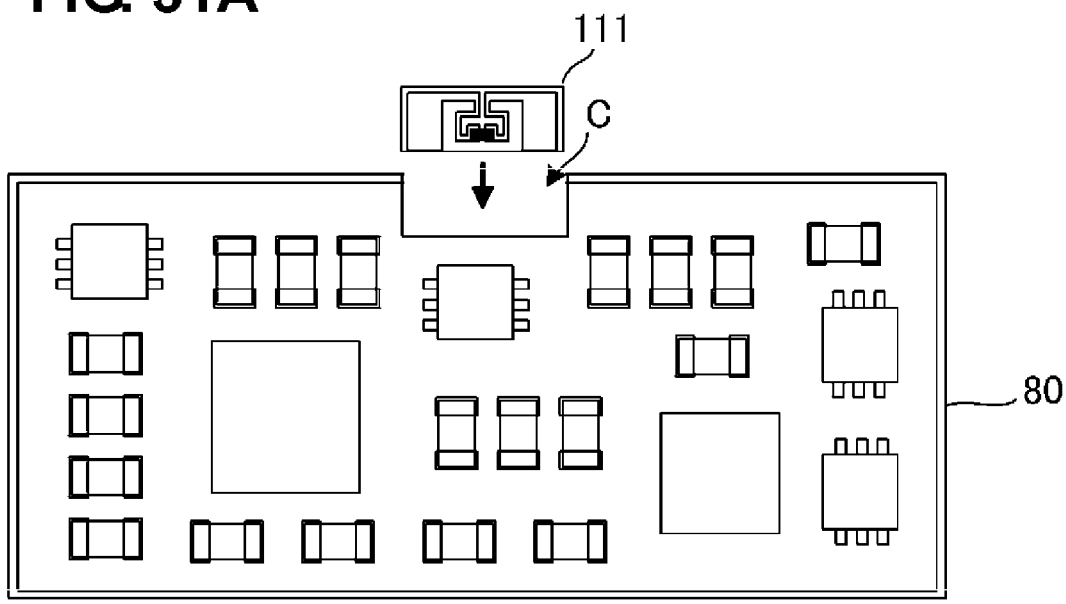
FIGS. 31A and 31B are plan views that show the configuration of a component for a wireless IC device according to a nineteenth preferred embodiment and the configuration of a wireless IC device provided with that component.
Figure 31B:
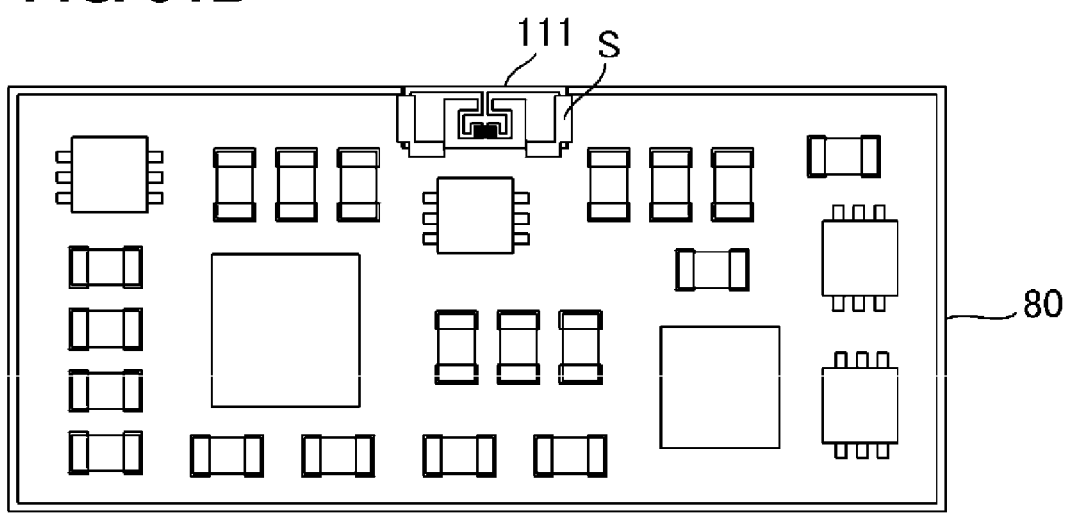

FIGS. 31A and 31B are plan views that show the configuration of a component for a wireless IC device according to a nineteenth preferred embodiment of the present invention and the configuration of a wireless IC device provided with that component.

As shown in FIG. 31A, the printed wiring substrate 80 has a cutout portion C provided at a location at which the component 111 for a wireless IC device is assembled, and then as shown in FIG. 31B, the component 111 for a wireless IC device is assembled to the location via soldering. Soldering should be performed over the entire portions at which the electrodes contact.

With the above-described configuration, the state in which the component 111 for a wireless IC device is assembled is closer to the final shape than that in the preferred embodiment shown in FIG. 29. Thus, more accurate design may be performed.

Twentieth Preferred Embodiment

Figure 32A:
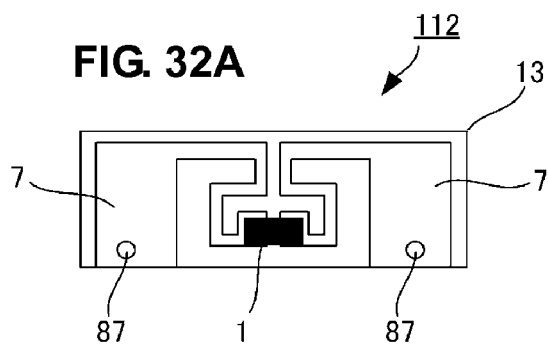
FIGS. 32A and 32B are plan views that show the configuration of a component for a wireless IC device according to a twentieth preferred embodiment of the present invention.
Figure 32B:
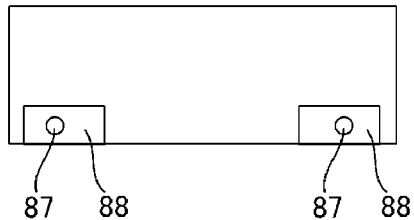
Figure 33:
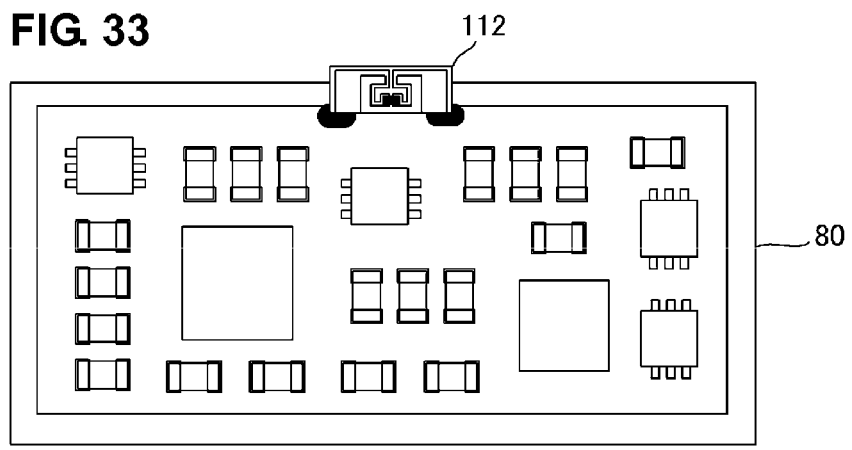
FIG. 33 is a plan view that shows the configuration of a wireless IC device provided with the component for a wireless IC device according to the twentieth preferred embodiment of the present invention.

FIGS. 32A and 32B are plan views that show the configuration of a component for a wireless IC device according to a twentieth preferred embodiment of the present invention. FIG. 33 is a plan view that shows the configuration of a wireless IC device provided with the component for a wireless IC device.

In this preferred embodiment, soldering electrode portions 88 are provided on the rear surface of the component for a wireless IC device, and are preferably connected to the loop electrode 7 on the front surface via through-holes 87, for example. As shown in FIG. 33, the soldering electrode portions 88 are soldered to the ground electrode of the printed wiring substrate 80.

In this manner, by providing the soldering electrode portions 88 on the rear surface, even when the location at which the ground electrode is provided does not extend to the edge of the printed wiring substrate 80, it may be easily mounted on the printed wiring substrate 80.

Twenty-First Preferred Embodiment

Figure 34:
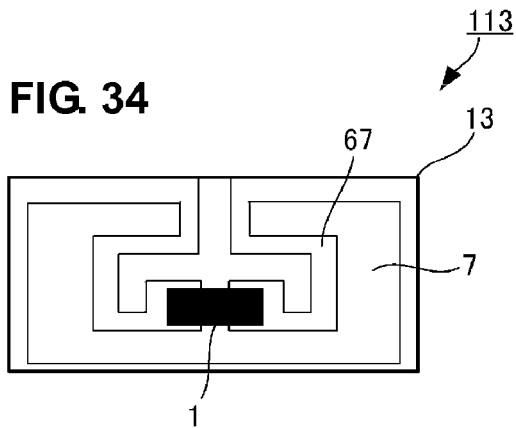
FIG. 34 is a plan view that shows the configuration of a component for a wireless IC device according to a twenty-first preferred embodiment of the present invention.

FIG. 34 is a plan view that shows the configuration of a component 113 for a wireless IC device according to a twenty-first preferred embodiment of the present invention. A mounting portion, on which the electromagnetic coupling module 1 is mounted, the matching circuit 67, and the loop electrode 7 are provided on a printed wiring substrate 13, such as a glass epoxy substrate, for example. The loop electrode 7 differs from the preferred embodiment shown in FIG. 28 in that the ends of the linear electrode are electrically connected to define a loop electrode.

The electromagnetic coupling module 1 is mounted on the printed wiring substrate 13 to define the component 113 for a wireless IC device. The component 113 for a wireless IC device, as in the case of the one shown in FIG. 29 or FIGS. 31A and 31B, is assembled to the printed wiring substrate.

In the component 113 for a wireless IC device, the loop electrode 7 is not significantly influenced by the soldering, and highly accurate design with less fluctuations in the impedance may be achieved. In addition, when it is used as an electronic component, variations in characteristics are reduced.

Note that in the above-described preferred embodiments, the wireless IC of the electromagnetic coupling module preferably utilizes the wireless IC chip. However, preferred embodiments of the present invention are not limited to ones using the wireless IC chip. For example, an organic semiconductor circuit may be provided on a substrate to define the wireless IC.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device comprising:
   a high-frequency device defined by one of an electromagnetic coupling module or a wireless IC chip, said electromagnetic module including a wireless IC and a power supply circuit substrate electrically connected or electromagnetically coupled to the wireless IC while being coupled to an external circuit; and
   a radiation electrode defined by a portion of an article and functioning as a radiator;
   wherein
   the high-frequency device is mounted on the radiation electrode; and
   the radiation electrode is coupled to the high-frequency device.

2. The wireless IC device according to claim 1, wherein
   the radiation electrode includes a conductive portion;
   a cutout portion is provided at an edge of the conductive portion; and
   the high-frequency device is arranged at the cutout portion and is coupled to the conductive portion at the cutout portion of the conductive portion.

3. The wireless IC device according to claim 1, wherein
   the radiation electrode includes a conductive portion;
   the conductive portion includes a non-conductive portion; and
   the high-frequency device is arranged at an end of the non-conductive portion and is coupled to the conductive portion around the non-conductive portion.

4. The wireless IC device according to claim 1, further comprising:
   a loop electrode coupled to the high-frequency device and directly electrically connected to the radiation electrode; wherein
   the loop electrode is provided at a mounting portion at which the high-frequency device is mounted, such that a loop plane of the loop electrode is arranged substantially in a direction of a plane of the radiation electrode.

5. The wireless IC device according to claim 4, further comprising:
   a matching circuit provided between the mounting portion of the high-frequency device and the loop electrode; wherein
   the matching circuit directly electrically connects the high-frequency device with the loop electrode.

6. The wireless IC device according to claim 1, further comprising:
   a loop electrode provided at a mounting portion at which the high-frequency device is mounted; wherein
   the loop electrode is coupled to the high-frequency device and is electromagnetically coupled to the radiation electrode via an insulating layer.

7. The wireless IC device according to claim 5, further comprising:
   a matching circuit provided between the mounting portion of the high-frequency device and the loop electrode; wherein
   the matching circuit directly electrically connects the high-frequency device with the loop electrode.

8. The wireless IC device according to claim 1, further comprising at least one of a resonant circuit or a matching circuit provided in the power supply circuit substrate.

9. The wireless IC device according to claim 8, wherein a resonant frequency of the resonant circuit substantially corresponds to a frequency of a signal exchanged by the radiation electrode.

10. The wireless IC device according to claim 1, wherein the radiation electrode is a metal film layer of an article package such that a sheet having a conductive layer is arranged in one of a bag shape or a package shape.

11. The wireless IC device according to claim 1, wherein the radiation electrode is an electrode pattern provided on a circuit substrate in an electronic device.

12. The wireless IC device according to claim 1, wherein the radiation electrode is a metal plate provided on a rear surface of a component in an electronic device.

13. The wireless IC device according to claim 1, further comprising:
    a resonant conductor having a resonant frequency that is substantially equal to an operating frequency of the high-frequency device; wherein
    the resonant conductor is coupled to the high-frequency device.

14. The wireless IC device according to claim 13, wherein the resonant conductor is arranged substantially parallel to an edge portion of the radiation electrode at which the cutout portion is provided.

15. The wireless IC device according to claim 13, wherein the resonant conductor has a length that is substantially equal to a side of the radiation electrode which the resonant conductor is located adjacent to.

16. The wireless IC device according to claim 13, wherein the resonant conductor is arranged so that a portion of the resonant conductor located adjacent to a location at which the high-frequency device is arranged is located substantially at the center.

17. The wireless IC device according to claim 13, wherein a plurality of the high-frequency devices are provided, and the resonant conductor is coupled to each of the high-frequency devices.

18. The wireless IC device according to claim 13, wherein the resonant conductor is separable from a body that defines the radiation electrode.

19. The wireless IC device according to claim 13, wherein the resonant conductor is provided in a margin portion of a printed wiring substrate.

20. The wireless IC device according to claim 13, wherein one of a casing of an apparatus on which the wireless IC device is mounted or another component mounted on the apparatus defines the resonant conductor.

21. A wireless IC device comprising:
a component including:
   a high-frequency device defined by one of an electromagnetic coupling module or a wireless IC chip including a wireless IC and a power supply circuit substrate that is electrically connected or electromagnetically coupled to the wireless IC while being coupled to an external circuit; and
   a substrate on which the high-frequency device is mounted and which includes at least two linear electrodes, a first end of each of the at least two linear electrodes being coupled to the high-frequency device; and
an article including a radiation electrode that is electrically connected to the second ends of the at least two linear electrodes to define a loop electrode.

22. A wireless IC device comprising:
a component including:
   a high-frequency device defined by one of an electromagnetic coupling module or a wireless IC chip including a wireless IC and a power supply circuit substrate that is electrically connected or electromagnetically coupled to the wireless IC while being coupled to an external circuit; and
   a substrate on which the high-frequency device is mounted and which includes at least two linear electrodes, a first end of each of the at least two linear electrodes being coupled to the high-frequency device; wherein
   second ends of the at least two linear electrodes are electrically connected to each other to define a loop electrode; and
an article provided with a conductor that is electrically connected to the loop electrode and defines a radiator.

* * * * *